(12) United States Patent
Shimizu et al.

(10) Patent No.: US 9,220,167 B2
(45) Date of Patent: Dec. 22, 2015

(54) WIRING SUBSTRATE, SEMICONDUCTOR DEVICE, AND METHOD OF MANUFACTURING WIRING SUBSTRATE

(71) Applicant: SHINKO ELECTRIC INDUSTRIES CO., LTD., Nagano-ken (JP)

(72) Inventors: Noriyoshi Shimizu, Nagano (JP); Masato Tanaka, Nagano (JP); Toshinori Koyama, Nagano (JP); Akio Rokugawa, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/623,689

(22) Filed: Feb. 17, 2015

(65) Prior Publication Data

US 2015/0245473 A1  Aug. 27, 2015

(30) Foreign Application Priority Data

Feb. 27, 2014  (JP) ................................. 2014-037475

(51) Int. Cl.
| | |
|---|---|
| H01L 23/12 | (2006.01) |
| H05K 1/02 | (2006.01) |
| H01L 23/498 | (2006.01) |
| H01L 21/48 | (2006.01) |
| H05K 1/03 | (2006.01) |
| H05K 1/11 | (2006.01) |
| H05K 3/46 | (2006.01) |
| H01L 23/15 | (2006.01) |
| H01L 23/538 | (2006.01) |

(52) U.S. Cl.
CPC ............ *H05K 1/0298* (2013.01); *H01L 21/486* (2013.01); *H01L 21/4857* (2013.01); *H01L 23/15* (2013.01); *H01L 23/49822* (2013.01); *H01L 23/49827* (2013.01); *H05K 1/036* (2013.01); *H05K 1/0366* (2013.01); *H05K 1/115* (2013.01); *H05K 3/46* (2013.01); *H01L 23/5385* (2013.01); *H01L 23/5389* (2013.01); *H05K 2201/09827* (2013.01); *H05K 2201/10204* (2013.01); *H05K 2201/10674* (2013.01)

(58) Field of Classification Search
CPC ..................... H01L 23/5226; H01L 23/49822; H01L 23/147; H01L 23/3735; H01L 23/49827; H01L 23/49833; H01L 23/142; H01L 23/49861
USPC .................. 257/700, 778, E23.006, E23.041; 174/250, 262; 361/719
See application file for complete search history.

(56) References Cited

U.S. PATENT DOCUMENTS

| | | | | |
|---|---|---|---|---|
| 5,321,210 | A * | 6/1994 | Kimbara et al. | 174/256 |
| 6,534,723 | B1 * | 3/2003 | Asai et al. | 174/255 |
| 8,367,943 | B2 * | 2/2013 | Wu et al. | 174/262 |
| 2001/0005545 | A1 * | 6/2001 | Andou et al. | 428/209 |
| 2013/0062108 | A1 * | 3/2013 | Kondo | 174/258 |

FOREIGN PATENT DOCUMENTS

| | | |
|---|---|---|
| JP | 2003-023252 | 1/2003 |
| JP | 2003-023253 | 1/2003 |

\* cited by examiner

*Primary Examiner* — Jasmine Clark
(74) *Attorney, Agent, or Firm* — Fish & Richardson P.C.

(57) ABSTRACT

A wiring substrate includes a first wiring structure, a second wiring structure stacked on an upper surface of the first wiring structure, and an outermost insulating layer stacked on a lower surface of the first wiring structure. The outermost insulating layer covers a part of a bottom wiring layer of the wiring layers forming the first wiring structure. The second wiring structure has a wiring density higher than that of the first wiring structure. A volume ratio V1/V2 is from 0.8 to 1.5, where V1 represents the volume of the wiring layers forming the entire second wiring structure, and V2 represents the volume of the bottom wiring layer in the first wiring structure.

10 Claims, 20 Drawing Sheets

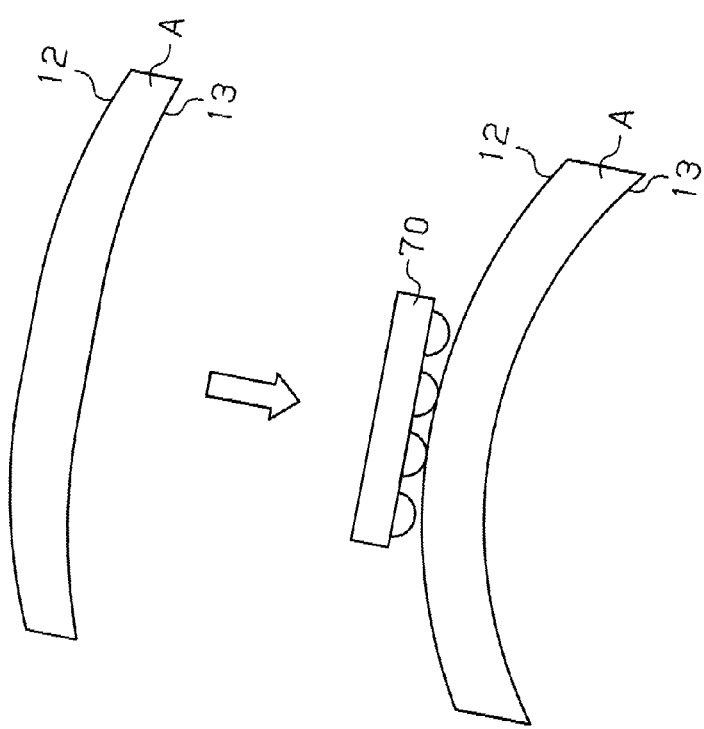
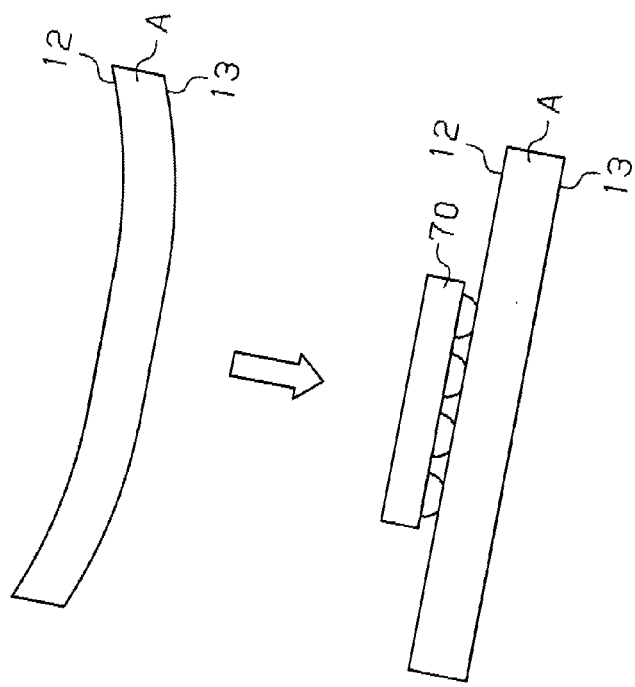

WIRING SUBSTRATE, SEMICONDUCTOR DEVICE, AND METHOD OF MANUFACTURING WIRING SUBSTRATE

CROSS-REFERENCE TO RELATED APPLICATIONS

This application is based upon and claims the benefit of priority from prior Japanese Patent Application No. 2014-037475, filed on Feb. 27, 2014, the entire contents of which are incorporated herein by reference.

FIELD

The present disclosure relates to a wiring substrate, a semiconductor device, and a method of manufacturing the wiring substrate.

BACKGROUND

In a build-up wiring substrate conventionally known as a wiring substrate for example for a semiconductor package, a stack of a build-up wiring layer and an insulating layer is formed on each of upper and lower surfaces of a core substrate with the intention of achieving a high-density wiring pattern (see Japanese Laid-Open Patent Publication Nos. 2003-023252 and 2003-023253, for example).

SUMMARY

For example, in an assembly formed by mounting a semiconductor chip above a wiring substrate and connecting a mounting substrate below the wiring substrate, upper and lower structures existing above and below the wiring substrate may differ in a physical value (such as a coefficient of thermal expansion or a coefficient of elasticity). Such a difference in the physical value may easily cause warp of the wiring substrate.

One aspect of the present invention is a wiring substrate including a first wiring structure formed by a stack of wiring layers and insulating layers, a second wiring structure formed by a stack of wiring layers and insulating layers and stacked on an upper surface of the first wiring structure, and an outermost insulating layer stacked on a lower surface of the first wiring structure, the outermost insulating layer covering a part of a bottom wiring layer of the wiring layers in the first wiring structure. The second wiring structure has a wiring density higher than that of the first wiring structure. A volume ratio V1/V2 is from 0.8 to 1.5, where V1 represents the volume of the wiring layers in the entire second wiring structure and V2 represents the volume of the bottom wiring layer in the first wiring structure.

Other aspects and advantages of the present invention will become apparent from the following description, taken in conjunction with the accompanying drawings, showing by way of example the principles of the invention.

BRIEF DESCRIPTION OF DRAWINGS

The invention, together with objects and advantages thereof, may best be understood by reference to the following description of the presently preferred embodiments together with the accompanying drawings in which:

FIGS. 24A and 24B are schematic views each illustrating a direction of warp of a wiring substrate.

DETAILED DESCRIPTION OF EMBODIMENTS

Figure 1:
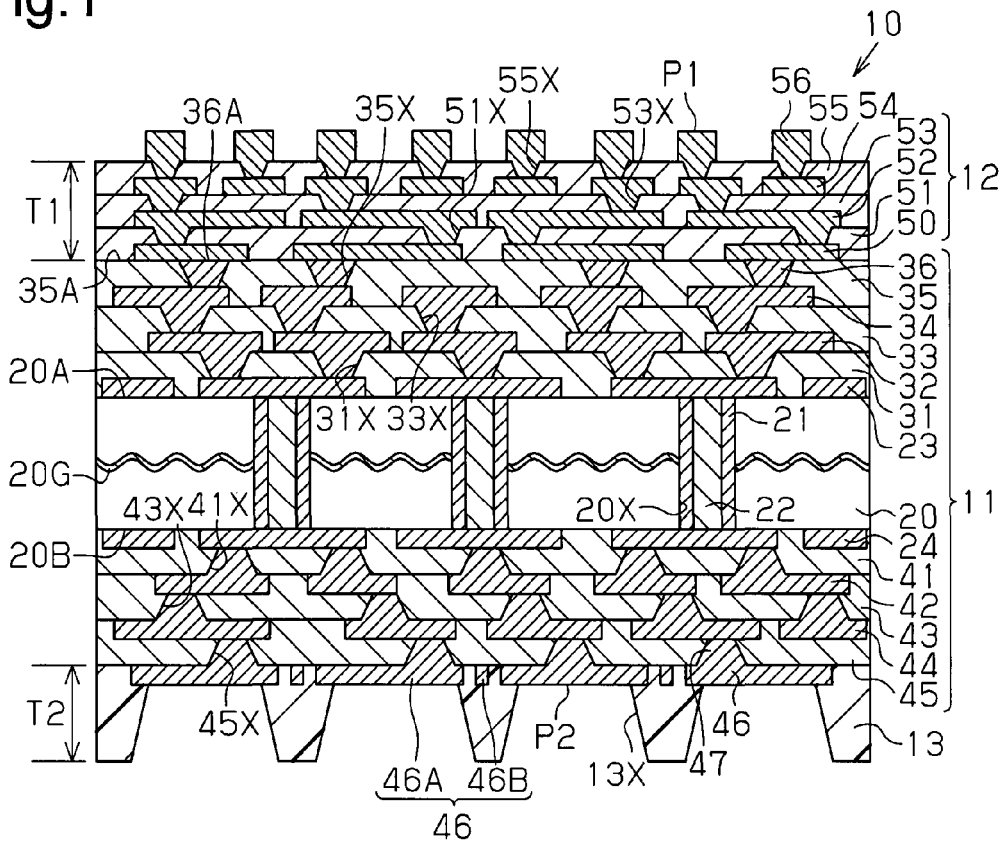
FIG. 1 is a diagrammatic sectional view of a wiring substrate according to a first embodiment taken along line 1-1 of FIG. 2.

In the drawings, elements are illustrated for simplicity and clarity and have not necessarily been drawn to scale. To facilitate understanding, hatching lines may not be illustrated in the cross-sectional drawings and screentones may be used instead.

A first embodiment will now be described below referring to FIGS. 1 to 11.

As illustrated in FIG. 1, a wiring substrate 10 includes a first wiring structure 11, a second wiring structure 12 stacked on one surface (upper surface, for example) of the first wiring structure 11, and a solder resist layer 13 stacked on an opposite surface (lower surface, for example) of the first wiring structure 11. The wiring substrate 10 may have any planar shape and any size. As an example, the planar shape of the wiring substrate 10 may be a square of from about 20 mm×20 mm to about 40 mm×40 mm.

The structure of the first wiring structure 11 is described first.

The first wiring structure 11 is a low-density wiring layer with wiring layers of a density lower than those of the second wiring structure 12. A core substrate 20 is arranged at the substantially central part in the thickness direction of the first wiring structure 11. The core substrate 20 may be a glass epoxy substrate formed by impregnating glass cloth (glass woven fabric) as a reinforcing material with a thermosetting insulating resin, the major component of which is an epoxy resin, and curing the resin, for example. The thermosetting insulating resin is not limited to the epoxy resin but it may also be a resin material such as a polyimide resin or a cyanate resin. The core substrate 20 has glass cloth 20G of an intended number (in FIG. 1, one). As an example, the glass cloth 20G includes glass fiber bundles juxtaposed in a first direction and glass fiber bundles juxtaposed in a second direction perpendicular to the first direction in a plan view that are woven in a plain weave in a lattice pattern. Each glass fiber bundle is formed of multiple glass fibers with each of a diameter of about 1 to 2 μm bundled together, for example. Each glass fiber bundle may have a thickness from about 5 to 50 μm, for example. The reinforcing material is not limited to the glass cloth 20G using the glass fiber bundles but it may also be woven fabric or non-woven fabric using a carbon fiber bundle, a polyester fiber bundle, a nylon fiber bundle, an aramid fiber bundle, or a liquid crystal polymer (LCP) fiber bundle, for example. The fiber bundle may be woven not only in a plain weave but also in a sateen weave or a twill weave. The core substrate 20 may contain a filler such as silica ($SiO_2$) or alumina ($Al_2O_3$), for example.

Figure 3:
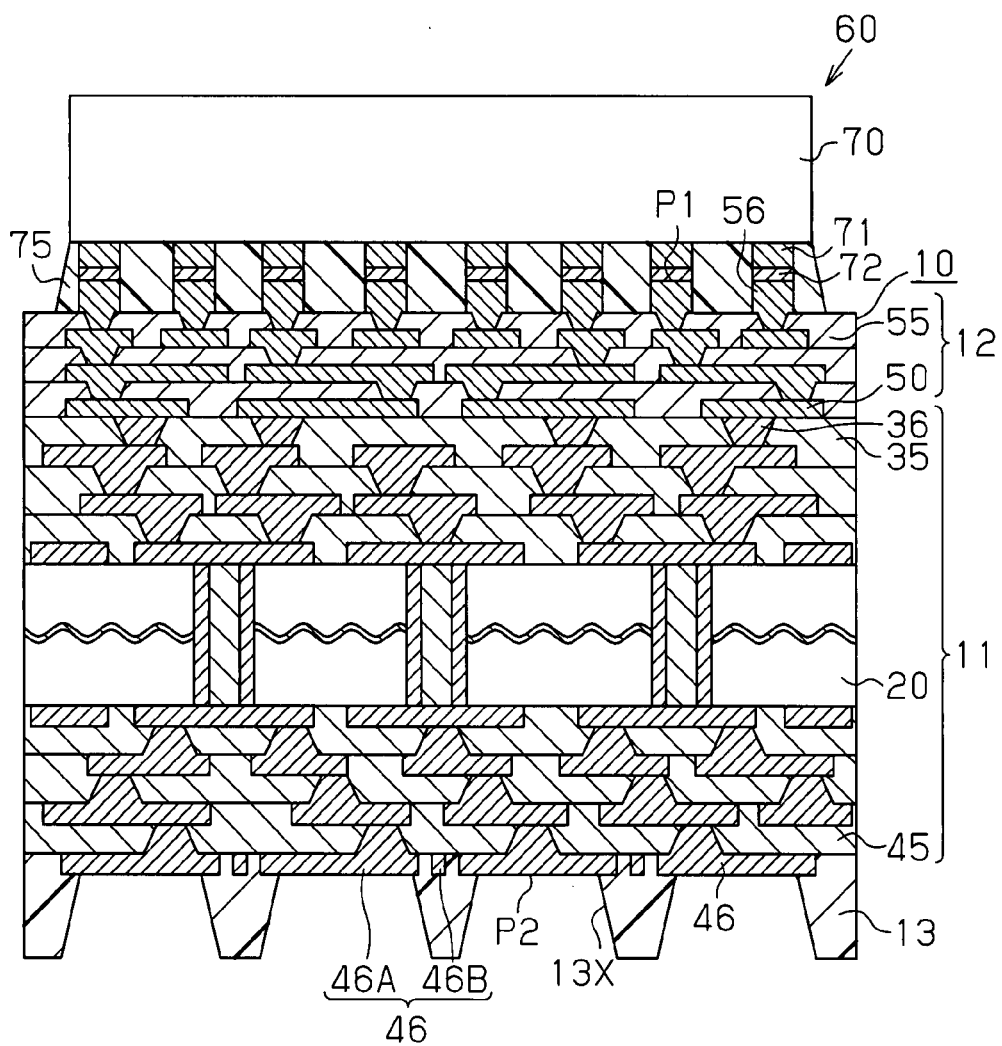
FIG. 3 is a diagrammatic sectional view of a semiconductor device according to the first embodiment.

The core substrate 20 is provided with through holes 20X in intended positions (in FIG. 3, three positions). The through holes 20X are formed so as to pass through the core substrate 20 from an upper surface 20A to a lower surface 20B of the core substrate 20. Although not illustrated in the drawings, the through holes 20X are formed into substantially circular in a plan view, for example. The through holes 20X may have a diameter from about 100 to 200 μm, for example. The through holes 20X are arranged in a pitch that may be from about 200 to 400 μm, for example.

A penetration electrode 21 is formed on the inner side surface of each through hole 20X so as to pass through the core substrate 20 in the thickness direction thereof. The center of the through hole 20X (through hole 20X on the inner side of the penetration electrode 21) is filled with resin 22. The penetration electrode 21 may be made of copper (CU) or a copper alloy, for example. The resin 22 may be made of an insulating resin such as an epoxy resin, for example.

A wiring layer 23 is formed on the upper surface 20A of the core substrate 20. A wiring layer 24 is formed on the lower surface 20B of the core substrate 20. The wiring layers 23 and 24 are electrically connected to each other through the penetration electrodes 21. The wiring layers 23 and 24 may be made of copper or a copper alloy, for example. The wiring layers 23 and 24 may have a thickness from about 15 to 35 μm, for example. The line and space (L/S) of the wiring layers 23 and 24 may be about 20 μm/20 μm, for example. The line and space shows the width of a wiring and a gap between adjacent wirings.

A stack is formed on the upper surface 20A of the core substrate 20. This stack includes an insulating layer 31, a wiring layer 32, an insulating layer 33, a wiring layer 34, an insulating layer 35, and via wirings 36 stacked in this order. The insulating layers 31, 33, and 35 may be made of a non-photosensitive insulating resin containing a thermosetting resin such as an epoxy resin or a polyimide resin as the major component thereof, for example. The insulating layers 31, 33, and 35 may contain a filler such as silica or alumina, for example. The wiring layers 32 and 34, and the via wirings 36 may be made of copper or a copper alloy, for example. The insulating layers 31, 33, and 35 may have a thickness from about 20 to 45 μm, for example. The wiring layers 32 and 34 may have a thickness from about 15 to 35 μm, for example. The line and space (L/S) of the wiring layers 32 and 34 may be about 20 μm/20 μm, for example.

The insulating layer 31 is formed on the upper surface 20A of the core substrate 20 so as to cover the wiring layer 23. The insulating layer 31 is provided with through holes 31X in intended positions. The through holes 31X pass through the insulating layer 31 in the thickness direction thereof to expose the upper surface of the wiring layer 23.

The wiring layer 32 is stacked on the upper surface of the insulating layer 31. The wiring layer 32 is electrically connected to the wiring layer 23 through via wirings filling in the through holes 31X. The wiring layer 32 is formed integrally with the via wirings filling in the through holes 31X, for example.

The insulating layer 33 is formed on the upper surface of the insulating layer 31 so as to cover the wiring layer 32. The insulating layer 33 is provided with through holes 33X in intended positions. The through holes 33X pass through the insulating layer 33 in the thickness direction thereof to expose the upper surface of the wiring layer 32.

The wiring layer 34 is stacked on the upper surface of the insulating layer 33. The wiring layer 34 is electrically connected to the wiring layer 32 through via wirings filling in the through holes 33X. The wiring layer 34 is formed integrally with the via wirings filling in the through holes 33X, for example.

The insulating layer 35 is formed on the upper surface of the insulating layer 33 so as to cover the wiring layer 34. The insulating layer 35 is provided with through holes 35X forming openings in intended positions of an upper surface 35A of the insulating layer 35 while passing through the insulating layer 35 in the thickness direction thereof to expose the upper surface of the wiring layer 34.

The upper surface 35A of the insulating layer 35 is a smooth surface (low-roughness surface) with not many irregularities. As an example, the upper surface 35A of the insulating layer 35 is lower in surface roughness than the inner side surfaces of the through holes 35X. The roughness of the upper surface 35A of the insulating layer 35 is set to be from about 15 to 40 nm in terms of a surface roughness Ra value, for example. The roughness of the inner side surfaces of the through holes 35X is set to be from about 300 to 400 nm in terms of the surface roughness Ra value, for example. The surface roughness Ra value is one of numerical values indicating surface roughness and is called arithmetic average roughness in some cases. The surface roughness Ra value is obtained by measuring the absolute values of heights changing in a measurement region from a surface as an average line and arithmetically determining the average of the absolute values.

The through holes 31X, the through holes 33X, and the through holes 35X are each formed into a tapered shape that becomes greater in a diameter from a lower side (side near the core substrate 20) toward an upper side (side near the second wiring structure 12) of FIG. 1. As an example, the through holes 31X, the through holes 33X, and the through holes 35X are each formed as an inverted truncated cone with an upper opening end of a diameter larger than that of a lower opening end thereof. The diameter of the upper opening end of the through holes 31X, the through holes 33X, and the through holes 35X may be from about 60 to 70 μm, for example.

The via wirings 36 electrically connecting the wiring layer 34 and a wiring layer 50 formed on the upper surface 35A of the insulating layer 35 are formed inside the through holes 35X. The via wirings 36 are formed so as to pass through the insulating layer 35 in the thickness direction thereof. Like the through holes 35X, the via wirings 36 are each formed into a tapered shape that becomes greater in a diameter from a lower side (side near the wiring layer 34) toward an upper side (side near the wiring layer 50) of FIG. 1. As an example, the via wirings 36 are each formed as a substantially inverted truncated cone with an upper end surface 36A of a diameter larger than the diameter of a lower end surface thereof. The upper end surfaces 36A of the via wirings 36 are exposed from the insulating layer 35. As an example, the upper end surfaces 36A of the via wirings 36 are substantially flush with the upper surface 35A of the insulating layer 35. The upper end surfaces 36A of the via wirings 36 are directly bonded to the wiring layer 50. The diameter of the upper end surfaces 36A of the via wirings 36 may be from about 60 to 70 µm, for example. The via wirings 36 may be made of copper or a copper alloy, for example.

A stack is formed on the lower surface 20B of the core substrate 20. This stack includes an insulating layer 41, a wiring layer 42, an insulating layer 43, a wiring layer 44, an insulating layer 45, and an outermost (bottom, for example) wiring layer 46 stacked in this order. The insulating layers 41, 43, and 45 may be made of a thermosetting insulating resin containing an insulating resin such as an epoxy resin or a polyimide resin as the major component thereof, for example. These insulating layers 41, 43, and 45 may contain a filler such as silica or alumina, for example. The wiring layers 42, 44, and 46 may be made of copper or a copper alloy, for example. The insulating layers 41, 43, and 45 may have a thickness from about 20 to 45 µm, for example. The wiring layers 42, 44, and 46 may have a thickness from about 15 to 35 µm, for example. The line and space (L/S) of the wiring layers 42, 44, and 46 may be about 20 µm/20 µm, for example.

The insulating layer 41 is formed on the lower surface 20B of the core substrate 20 so as to cover the wiring layer 24. The insulating layer 41 is provided with through holes 41X in intended positions. The through holes 41X pass through the insulating layer 41 in the thickness direction thereof to expose the lower surface of the wiring layer 24.

The wiring layer 42 is stacked on the lower surface of the insulating layer 41. The wiring layer 42 is electrically connected to the wiring layer 24 through via wirings filling in the through holes 41X. The wiring layer 42 is formed integrally with the via wirings filling in the through holes 41X, for example.

The insulating layer 43 is formed on the lower surface of the insulating layer 41 so as to cover the wiring layer 42.

The insulating layer 43 is provided with through holes 43X in intended positions. The through holes 43X pass through the insulating layer 43 in the thickness direction thereof to expose the lower surface of the wiring layer 42.

The wiring layer 44 is stacked on the lower surface of the insulating layer 43. The wiring layer 44 is electrically connected to the wiring layer 42 through via wirings filling in the through holes 43X. The wiring layer 44 is formed integrally with the via wirings filling in the through holes 43X, for example.

The insulating layer 45 is formed on the lower surface of the insulating layer 43 so as to cover the wiring layer 44.

The insulating layer 45 is a bottom insulating layer in the first wiring structure 11. The insulating layer 45 is provided with through holes 45X in intended positions. The through holes 45X pass through the insulating layer 45 in the thickness direction thereof to expose the lower surface of the wiring layer 44.

The through holes 41X, the through holes 43X, and the through holes 45X are each formed into a tapered shape that becomes greater in a diameter from an upper side (side near the core substrate 20) toward a lower side (side near the solder resist layer 13) of FIG. 1. As an example, the through holes 41X, the through holes 43X, and the through holes 45X are each formed as a truncated cone with a lower opening end of a diameter larger than that of an upper opening end thereof. The diameter of the lower opening end of the through holes 41X, the through holes 43X, and the through holes 45X may be from about 60 to 70 µm, for example.

The wiring layer 46 is stacked on the lower surface of the insulating layer 45. The wiring layer 46 is a bottom (outermost) wiring layer in the first wiring structure 11. The wiring layer 46 is partially connected to the wiring layer 44 electrically through via wirings 47 filling in the through holes 45X.

The wiring layer 46 for example has wiring patterns 46A formed integrally with the via wirings 47 and electrically connected to the wiring layer 44 through the via wirings 47, and dummy patterns 46B formed in parts of regions where the wiring patterns 46A are not formed (arranged). The wiring patterns 46A function as external connection pads P2 to be connected to external connection terminals such as solder balls or lead pins used for mounting the wiring substrate 10 on a mounting substrate such as a motherboard, for example. The dummy patterns 46B are formed into solid patterns, for example. The dummy patterns 46B are not electrically connected for example to the wiring layer 44 (via wirings 47) directly above the dummy patterns 46B but they are electrically isolated (floating).

Figure 2:
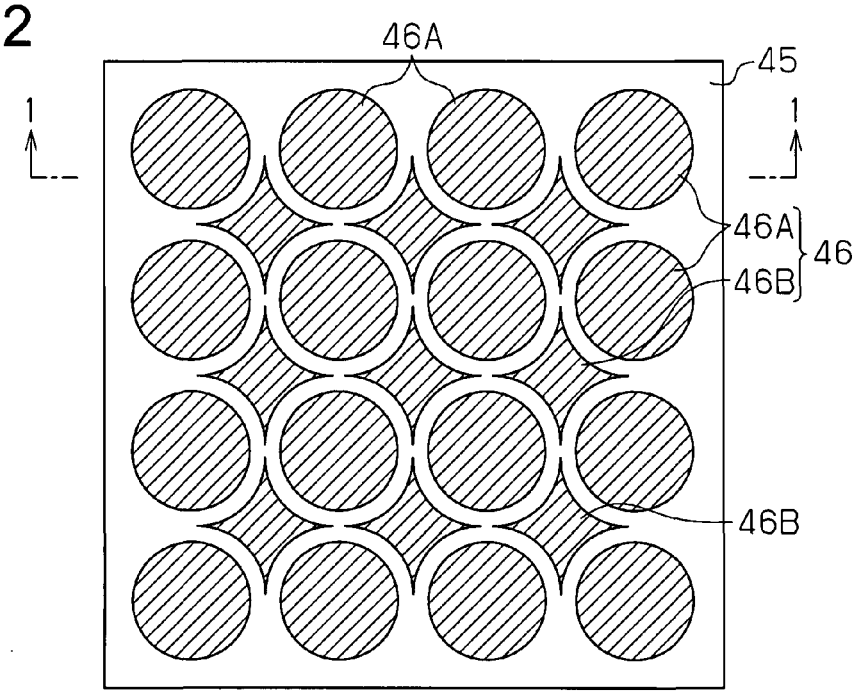
FIG. 2 is a diagrammatic plan view of the wiring substrate of FIG. 1 from which a solder resist layer 13 of FIG. 1 is omitted.

As illustrated in FIG. 2, the wiring patterns 46A are arranged in a matrix in a plan view, for example. The dummy patterns 46B are formed between adjacent wiring patterns 46A, for example. The wiring patterns 46A and the dummy patterns 46B may be formed into any respective planar shapes and any respective sizes. As an example, the planar shape of the wiring patterns 46A may be a circle of a diameter from about 250 to 400 µm. The dummy patterns 46B are formed into a substantially rhombic shape in a plan view, for example.

As described above, in the first wiring structure 11 illustrated in FIG. 1, the stack formed on the upper surface of the core substrate 20 includes insulating layers of the same number as that of insulating layers in the stacked formed on the lower surface of the core substrate 20. Further, the stack formed on the upper surface of the core substrate 20 includes wiring layers of the same number as that of wiring layers in the stacked formed on the lower surface of the core substrate 20. Specifically, the insulating layers and the wiring layers are both formed substantially vertically symmetric relative to the core substrate 20. This provides the first wiring structure 11 with high resistance to warp. Forming all the insulating layers into the same thickness provides a better balance between the upper side and the lower side, so that it particularly acts to provide high resistance to warp.

In this embodiment, three insulating layers (insulating layers 31, 33, and 35) are formed above the upper surface 20A of the core substrate 20, whereas three insulating layers (insulating layers 41, 43, and 45) are formed below the lower surface 20B of the core substrate 20. The numbers of insulating layers to be formed above the upper surface 20A and below the lower surface 20B of the core substrate 20 are not limited to three. Four wiring layers (wiring layers 23, 32, 34, and via wirings 36) are formed above the upper surface 20A of the core substrate 20, whereas four wiring layers (wiring layers 24, 42, 44, and 46) are formed below the lower surface 20B of the core substrate 20. The numbers of wiring layers to be formed above the upper surface 20A and below the lower surface 20B of the core substrate 20 are not limited to four.

The structure of the second wiring structure 12 is descried next.

The second wiring structure 12 is a high-density wiring layer with wiring layers of a density higher than those of the first wiring structure 11. The second wiring structure 12 includes a wiring layer 50 on the insulating layer 35, an insulating layer 51, a wiring layer 52, an insulating layer 53, a wiring layer 54, an insulating layer 55, and a wiring layer 56 stacked in this order. The second wiring structure 12 has a thickness T1 that may be from about 20 to 40 µm, for example. The thickness T1 for example corresponds to a total of those of all the insulating layers in the second wiring structure 12 (specifically, a thickness from the upper surface 35A of the insulating layer 35 to the upper surface of the insulating layer 55).

The wiring layers 50, 52, 54, and 56 may be made of copper or a copper alloy, for example. The insulating layers 51, 53, and 55 may be made of a photosensitive insulating resin containing a phenolic resin or a polyimide resin as the major component thereof, for example. These insulating layers 51, 53, and 55 may contain a filler such as silica or alumina, for example.

The wiring layers 50, 52, 54, and 56 are thinner than the wiring layers in the first wiring structure 11. The wiring layers 50, 52, and 54 may have a thickness from about 1 to 3 µm, for example. The wiring layer 56 may have a thickness from about 10 to 15 µm, for example. The line and space (L/S) of the wiring layers 50, 52, and 54 may be about 2 µm/2 µm, for example. The insulating layers 51, 53, and 55 are thinner than the insulating layers in the first wiring structure 11. The insulating layers 51, 53, and 55 may have a thickness from about 5 to 10 µm, for example.

The wiring layer 50 is stacked on the upper surface 35A of the insulating layer 35 so as to be connected to the upper end surfaces 36A of the via wirings 36. Specifically, the lower surface of the wiring layer 50 partially contacts the upper end surfaces 36A of the via wirings 36, thereby electrically connecting the wiring layer 50 and the via wirings 36. In other words, the wiring layer 50 and the via wirings 36 are electrically connected but are not integral. The wiring layer 50 has a seed layer (such as a stack of a titanium (Ti) layer and a Cu layer) formed on the upper end surfaces 36A of the via wirings 36 (copper (Cu) layer, for example), and a metal layer (such as a Cu layer) formed on the seed layer.

The insulating layer 51 is formed on the upper surface 35A of the insulating layer 35 so as to cover the wiring layer 50. The insulating layer 51 is formed so as to entirely cover the upper surface 35A of the insulating layer 35 exposed from the wiring layer 50. The insulating layer 51 is provided with through holes 51X in intended positions. The through holes 51X pass through the insulating layer 51 in the thickness direction thereof to expose the upper surface of the wiring layer 50.

The wiring layer 52 is stacked on the upper surface of the insulating layer 51. The wiring layer 52 is electrically connected to the wiring layer 50 through via wirings filling in the through holes 51X. The wiring layer 52 is formed integrally with the via wirings filling in the through holes 51X, for example.

The insulating layer 53 is formed on the upper surface of the insulating layer 51 so as to cover the wiring layer 52. The insulating layer 53 is provided with through holes 53X in intended positions. The through holes 53X pass through the insulating layer 53 in the thickness direction thereof to expose the upper surface of the wiring layer 52.

The wiring layer 54 is stacked on the upper surface of the insulating layer 53. The wiring layer 54 is electrically connected to the wiring layer 52 through via wirings filling in the through holes 53X. The wiring layer 54 is formed integrally with the via wirings filling in the through holes 53X, for example.

The insulating layer 55 is formed on the upper surface of the insulating layer 53 so as to cover the wiring layer 54. The insulating layer 55 is provided with through holes 55X in intended positions. The through holes 55X pass through the insulating layer 55 in the thickness direction thereof to expose the upper surface of the wiring layer 54.

The through holes 51X, the through holes 53X, and the through holes 55X are each formed into a tapered shape that becomes greater in a diameter from a lower side (side near the first wiring structure 11) toward an upper side (side near the wiring layer 56) of FIG. 1. As an example, the through holes 51X, the through holes 53X, and the through holes 55X are each formed as an inverted truncated cone with an upper opening end of a diameter larger than that of a lower opening end thereof. The diameter of the upper opening end of the through holes 51X, the through holes 53X, and the through holes 55X may be from about 10 to 20 µm, for example.

The wiring layer 56 is stacked on the upper surface of the insulating layer 55. The wiring layer 56 is electrically connected to the wiring layer 54 through via wirings filling in the through holes 55X. The wiring layer 56 has pads P1 formed integrally with the via wirings filling in the through holes 55X, for example, and projecting from the upper surface of the insulating layer 55. The pad surfaces of the pads P1 may have any planar shape and any size. As an example, the pad surface of the pads P1 may be a circle of a diameter from about 20 to 30 µm. The pads P1 are arranged in a pitch that may be from about 40 to 60 µm, for example. The pads P1 function as pads for mounting of an electronic component to be used for making electrical connection to an electronic component such as a semiconductor chip.

Where necessary, a surface-treated layer may be formed on a surface (an upper surface and a side surface, or only the upper surface) of each pad P1. Examples of the surface-treated layer include a stack of a gold (Au) layer, a nickel (Ni) layer, and an Au layer (a metal layer including the Ni layer and the Au layers stacked in this order) and a stack of an Ni layer, a palladium (Pd) layer, and an Au layer (a metal layer including the Ni, Pd, and Au layers stacked in this order). These Ni, Ai, and Pd layers may be metal layers (electroless plated metal layers) formed by electroless plating, for example. The Ni layer is a metal layer made of Ni or an Ni alloy. The Au layer is a metal layer made of Au or an Au alloy. The Pd layer is a metal layer made of Pd or a Pd alloy. Alternatively, the surface-treated layer may be formed by antioxidation process such as OSP (organic solderability preservative) process on the surface (the upper and side surfaces, or only the upper surface) of each pad P1. In some examples, the OSP process forms an organic compound film/layer, such as an azole compound film/layer, an imidazole compound film/layer, or the like.

A volume V1 of the wiring layers 50, 52, 54, and 56 in the entire second wiring structure 12 is set to be substantially the same as a volume V2 of the bottom wiring layer 46 (specifically, the wiring patterns 46A and the dummy patterns 46B formed on the lower surface of the bottom insulating layer 45) in the first wiring structure 11. As an example, setting the volume V1 of the wiring layers 50, 52, 54, and 56 formed above the top insulating layer 35 in the first wiring structure 11 to be substantially the same as the volume V2 of the wiring layer 46 formed below the bottom insulating layer 45 in the first wiring structure 11 may reduce the amount of warp of the wiring substrate 10.

As an example, a ratio V1/V2 of the volume V1 of the wiring layers 50, 52, 54, and 56 relative to the volume V2 of the bottom wiring layer 46 is preferably from 0.8 to 1.5, more preferably, from 1.0 to 1.5. Setting the volume ratio V1/V2 in this way makes it possible to reduce the amount of warp of the wiring substrate 10 more appropriately, as will be described in detail later in the section of warp simulation.

As an example, the volume ratio V1/V2 may be set to a certain value by appropriately controlling a formation region for the dummy patterns 46B or the thickness of the wiring layer 46 and those of the wiring layers 50, 52, 54, and 56.

On the other hand, the solder resist layer 13 is an outermost insulating layer in the outermost layer (bottom layer, for example) of the wiring substrate 10. The solder resist layer 13 is formed on the lower surface of the first wiring structure 11 (on the lower surface of the insulating layer 45 in the bottom layer of the first wiring structure 11, for example) so as to cover the bottom wiring layer 46. The solder resist layer 13 is formed so as to cover the wiring patterns 46A partially while covering surfaces (lower surfaces and side surfaces) of the dummy patterns 46B entirely.

The solder resist layer 13 is provided with openings 13X through which parts of the bottom wiring layer 46 (parts of the wiring patterns 46A, for example) are exposed as the external connection pads P2. The external connection pads P2 are formed to be connected to external connection terminals such as solder balls or lead pins used for mounting the wiring substrate 10 on a mounting substrate such as a motherboard. Where necessary, a surface-treated layer may be formed on each wiring pattern 46A exposed through the corresponding opening 13X. Examples of the surface-treated layer include a stack of an Au layer, an Ni layer, and an Au layer (a metal layer including the Ni layer and the Au layers stacked in this order) and a stack of an Ni layer, a Pd layer, and an Au layer (a metal layer including the Ni, Pd, and Au layers stacked in this order). These Ni, Ai, and Pd layers may be metal layers formed by electroless plating, for example. Alternatively, the surface-treated layer may be formed by antioxidation process such as OSP process on the lower surface of each external connection pad P2. The wiring patterns 46A themselves (or the surface-treated layers themselves if such layers are formed on the wiring patterns 46A) exposed through the openings 13X may function as external connection terminals.

The pad surfaces of the external connection pads P2 and the openings 13X may be formed into any planar shapes and any sizes. As an example, the pad surfaces of the external connection pads P2 and the openings 13X may be a circle of a diameter from about 200 to 300 μm. The solder resist layer 13 may be made of a photosensitive insulating resin containing a phenolic resin or a polyimide resin as the major component thereof, for example. The solder resist layer 13 may contain a filler such as silica or alumina, for example.

The solder resist layer 13 has a thickness T2, specifically the thickness T2 from the lower surface of the insulating layer 45 to the lower surface of the solder resist layer 13 that is set to be equal to or greater than the thickness T1 of the second wiring structure 12. If the thickness T1 of the second wiring structure 12 is 30 μm, for example the thickness T2 of the solder resist layer 13 may be from about 30 to 50 μm, for example. As an example, a ratio (T1/T2) of the thickness T1 of the second wiring structure 12 relative to the thickness T2 of the solder resist layer 13 is preferably 1 or less, more preferably, 0.75 or less. Setting the thickness of the solder resist layer 13 in this way makes it possible to reduce the amount of warp of the wiring substrate 10.

In the wiring substrate 10, it is preferable that the core substrate 20 have a coefficient of elasticity of about 30 GPa and a coefficient of thermal expansion of about 10 ppm/degree Celsius. It is preferable that the insulating layers 31, 33, 35, 41, 43, and 45 containing a thermosetting resin (non-photosensitive resin) as the major component thereof have a coefficient of elasticity from about 5 GPa to about 15 GPa and a coefficient of thermal expansion from about 10 to 40 ppm/degree Celsius. It is preferable that the insulating layers 51, 53, and 55 containing a photosensitive resin as the major component thereof have a coefficient of elasticity of about 5 GPa and a coefficient of thermal expansion from about 50 to 70 ppm/degree Celsius. It is preferable that the solder resist layer 13 containing a photosensitive resin as the major component thereof have a coefficient of elasticity from about 2 to 4 GPa and a coefficient of thermal expansion from about 40 to 50 ppm/degree Celsius.

The coefficient of thermal expansion of each insulating layer may be controlled at a certain value with the content of a filler. Meanwhile, a large content of a filler disables exposure. This imposes a limit (upper limit) on the content of a filler that may be contained in an insulating layer containing a photosensitive resin as the major component thereof. Thus, the insulating layer containing a photosensitive resin as the major component thereof tends to have a coefficient of thermal expansion greater than that of an insulating layer containing a thermosetting resin as the major component thereof. Examples of the filler include silica and alumina mentioned above and additionally, Kaolin ($Al_2Si_2O_5$ ($OH_4$)) and Talc ($Mg_3Si_4O_{10}(OH_2)$). Alternatively, a mixture of these elements may be used as the filler.

Setting the physical values (coefficient of elasticity and coefficient of thermal expansion) in the aforementioned way makes the wiring substrate 10 softer gradually in a direction toward an outer layer relative to the core substrate 20. This achieves a synergistic effect together with the aforementioned relationship between the volume of the wiring layers 50, 52, 54, and 56 and that of the wiring layer 46 and the aforementioned relationship between the thickness of the solder resist layer 13 and that of the second wiring structure 12 to suppress the warp of the wiring substrate 10.

The structure of a semiconductor device 60 is described next.

As illustrated in FIG. 3, the semiconductor device 60 includes the wiring substrate 10, one or multiple semiconductor chips 70, and an underfill resin 75.

The semiconductor chip 70 is flip-chip mounted on the wiring substrate 10. Specifically, connection terminals 71 provided on a circuit formation surface (lower surface, for example) of the semiconductor chip 70 are bonded to the pads P1 of the wiring substrate 10 through bonding members 72, thereby electrically connecting the semiconductor chip 70 to the pads P1 (wiring layer 56) through the connection terminals 71 and the bonding members 72.

The semiconductor chip 70 may be a logic chip such as a CPU (central processing unit) chip or a GPU (graphics processing unit) chip, for example. Alternatively, the semiconductor chip 70 may be a memory chip such as a DRAM (dynamic random access memory chip), an SRAM (static random access memory) chip or a flash memory chip, for example. If multiple semiconductor chips 70 are to be mounted on the wiring substrate 10, a logic chip and a memory chip may be mounted in combination on the wiring substrate 10.

The semiconductor chip 70 may have a size from about 3 mm×3 mm to about 12 mm×12 mm in a plan view, for example. The semiconductor chip 70 may have a thickness from about 50 to 100 μm, for example.

Metal posts for example may be used as the connection terminals 71. The connection terminals 71 are columnar connection terminals extending downward from the circuit formation surface of the semiconductor chip 70. The connection terminals 71 in this example are formed into circular columns, for example. The connection terminals 71 may have a height from about 10 to 20 μm, for example. The connection terminals 71 may have a diameter from about 20 to 30 μm, for example. The connection terminals 71 are arranged in a pitch that may be from about 40 to 60 μm, for example. The connection terminals 71 may be made of copper or a copper alloy, for example. Not only the metal posts but also metal bumps may be used as the connection terminals 71, for example.

The bonding members 72 are bonded to the pads P1 and the connection terminals 71. The bonding members 72 may be formed of a tin (Sn) layer or formed by soldering with lead-free (Pd-free) solder, for example. Examples of a material used for the soldering include lead-free Sn-silver (Ag) solder, lead-free Sn—Cu solder, and lead-free Sn—Ag—Cu solder. The bonding members 72 may have a thickness from about 5 to 15 μm, for example.

The underfill resin 75 fills in a gap between the wiring substrate 10 and the semiconductor chip 70. The underfill resin 75 may be made of an insulating resin such as an epoxy resin, for example.

A method of manufacturing the wiring substrate 10 is described next. The manufacturing method described below is a multi-piece manufacturing method, which first prepares a block including multiple parts serving as the wiring substrates 10 and then cuts the block to singulate a large number of wiring substrates 10.

Figure 4A:
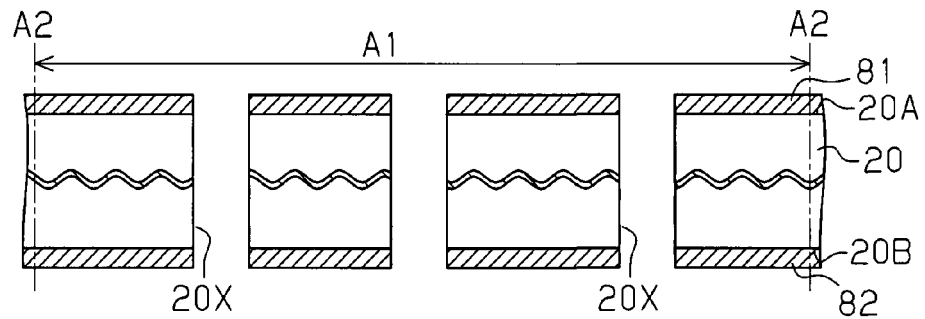
FIGS. 4A to 4D, 5A to 5C, 6A, 6B, 7A, 7B, 8A, 8B, 9A, 9B, 10A and 10B are diagrammatic sectional views illustrating a method of manufacturing the wiring substrate according to the first embodiment.

First, in a step of FIG. 4A, a base material is prepared including a metal foil 81 shaped as a flat plate stacked on the upper surface 20A of the core substrate 20 and a metal foil 82 as a flat plate stacked on the lower surface 20B of the core substrate 20. At this time, a large-size substrate out of which a large number of wiring substrates 10 may be formed is prepared as the core substrate 20. More specifically, the core substrate 20 includes multiple regions A1 in each of which a structure corresponding to the wiring substrate 10 is to be formed. After the structures corresponding to the wiring substrates 10 are formed in the regions A1, the core substrate 20 is cut along a cutting line A2 with a slicer or the like. This separates the structures corresponding to the wiring substrates 10 as individual pieces, thereby manufacturing the multiple wiring substrates 10. The metal foil 81 and the metal foil 82 may be copper foil of a thickness from about 10 to 20 μm, for example.

Next, the multiple through holes 20X are formed in the core substrate 20 (base material). The through holes 20X may be formed by drilling, for example.

Figure 4B:
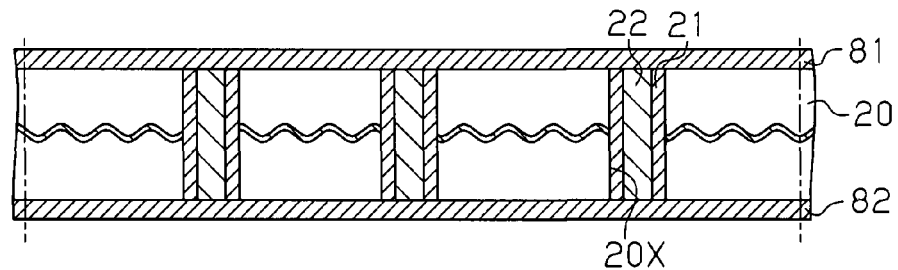

Next, in a step of FIG. 4B, the penetration electrode 21 is formed on the inner side surface of each through hole 20X by electroless plating and electrolytic plating using copper, for example. Then, the center of each through hole 20X after formation of the penetration electrode 21 is filled with an insulating resin such as an epoxy resin to form the resin 22. Copper patterns are formed for example by electroless plating and electrolytic plating in the respective upper end surfaces and the respective lower end surfaces of the penetration electrode 21 and the resin 22. In FIG. 4B, the copper patterns formed in the respective upper end surfaces and the respective lower end surfaces of the penetration electrode 21 and the resin 22 are not illustrated distinctively from the metal foil around these copper patterns. Thus, in FIG. 4B, areas formed into the copper patterns are illustrated to be parts of the metal foil 81 and the metal foil 82 as flat plates.

Figure 4C:
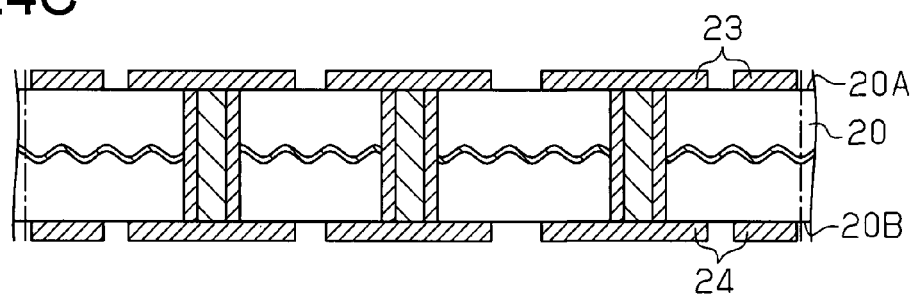

Next, the metal foil 81 and the metal foil 82 as flat plates are patterned to form the wiring layer 23 on the upper surface 20A of the core substrate 20 and the wiring layer 24 on the lower surface 20B of the core substrate 20 as illustrated in FIG. 4C. In this way, the wiring layers 23 and 24 are formed by subtractive process, for example.

Figure 4D:
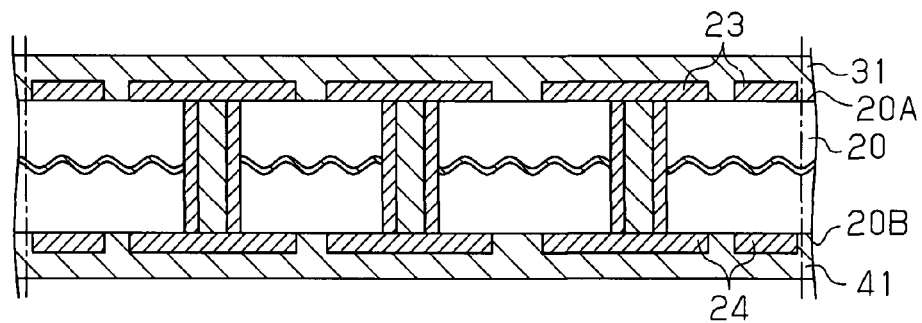

Next, in a step of FIG. 4D, the insulating layer 31 is formed to cover the upper surface 20A of the core substrate 20 and the wiring layer 23 and the insulating layer 41 is formed to cover the lower surface 20B of the core substrate 20 and the wiring layer 24. If resin films are used to form the insulating layers 31 and 41, the resin films are laminated on the upper surface 20A and the lower surface 20B of the core substrate 20, for example. Then, the resin films are processed under heat at a temperature (from about 130 to 200 degree Celsius, for example) not falling below a curing temperature while being pressed to cure the resin films, thereby forming the insulating layers 31 and 41. At this time, inclusion of a void may be prevented by laminating the resin films in a vacuum atmosphere. The resin films may be films of a thermosetting resin containing an epoxy resin as the major component thereof, for example. If a liquid or paste insulating resin is used to form the insulating layers 31 and 41, the liquid or paste insulating resin is applied onto the upper surface 20A and the lower surface 20B of the core substrate 20 for example by spin coating. Then, the applied insulating resin is processed under heat at a temperature not falling below a curing temperature to cure the insulating resin, thereby forming the insulating layers 31 and 41. The liquid or paste insulating resin may be a thermosetting resin containing an epoxy resin as the major component thereof, for example.

Figure 5A:
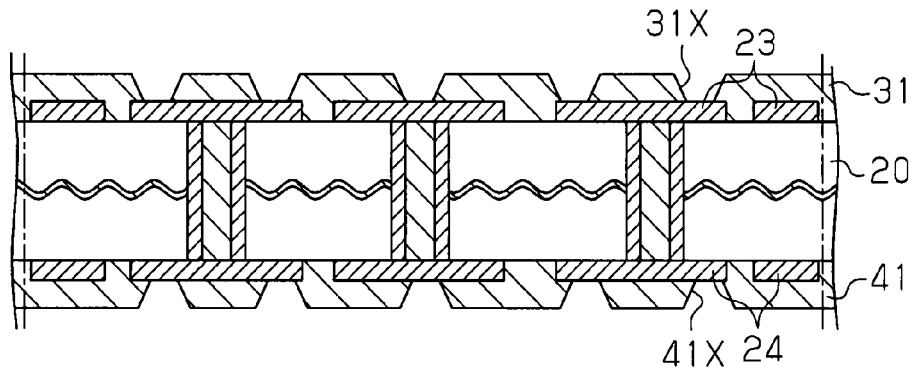

Next, in a step of FIG. 5A, the through holes 31X are formed in certain positions of the insulating layer 31 so as to expose parts of the upper surface of the wiring layer 23. Further, the through holes 41X are formed in certain positions of the insulating layer 41 so as to expose parts of the lower surface of the wiring layer 24. The through holes 31X and the through holes 41X may be formed by laser processing with a $CO_2$ laser or an UV-YAG laser, for example. If the through holes 31X and the through holes 41X are formed by laser processing, desmear process is performed subsequently to remove smears of resin attached to surfaces of the wiring layers 23 and 24 exposed at the bottoms of the through holes 31X and the through holes 41X.

Figure 5B:
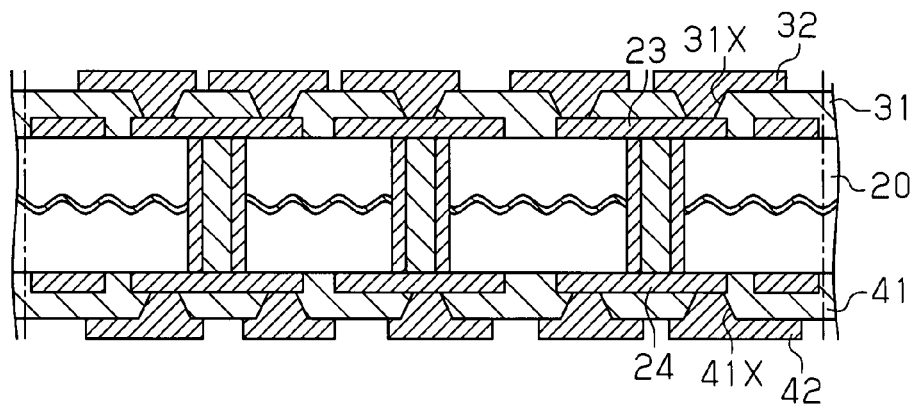

Next, in a step of FIG. 5B, the via wirings are formed to fill in the through holes 31X in the insulating layer 31 and the wiring layer 32 is stacked on the upper surface of the insulating layer 31 to be electrically connected through these via wirings to the wiring layer 23. Further, the via wirings are formed to fill in the through holes 41X in the insulating layer 41 and the wiring layer 42 is stacked on the lower surface of the insulating layer 41 to be electrically connected through these via wirings to the wiring layer 24. The wiring layers 32 and 42 may be formed by any of various processes including semiadditive process and subtractive process.

Figure 5C:
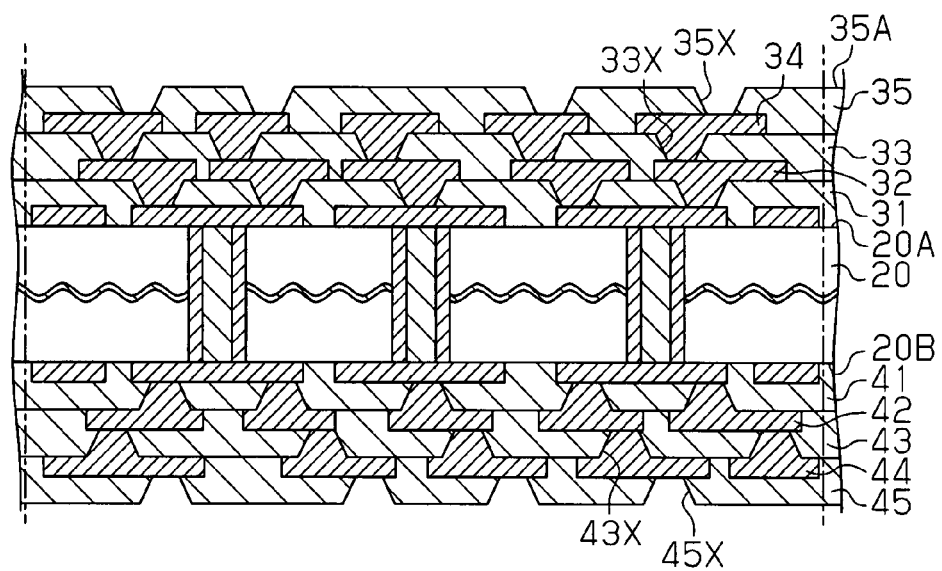

Next, the steps of FIGS. 4D to 5B are repeated to stack the insulating layer 33 and the wiring layer 34 on the upper surface of the insulating layer 31 and stack the insulating layer 43 and the wiring layer 44 on the lower surface of the insulating layer 41 as illustrated in FIG. 5C.

In the step of in FIG. 5C, the steps of FIGS. 4D and 5A are repeated to stack the insulating layer 35 with the through holes 35X on the upper surface of the insulating layer 33 and to stack the insulating layer 45 with the through holes 45X on the lower surface of the insulating layer 43.

If the through holes 35X and the through holes 45X are formed by laser processing, desmear process is performed subsequently to remove smears of resin attached to surfaces of the wiring layers 34 and 44 exposed at the bottoms of the through holes 35X and the through holes 45X. This desmear process roughens the inner side surfaces of the through holes 35X and the upper surface 35A of the insulating layer 35 while roughening the inner side surfaces of the through holes 45X and the lower surface of the insulating layer 45.

Figure 6A:
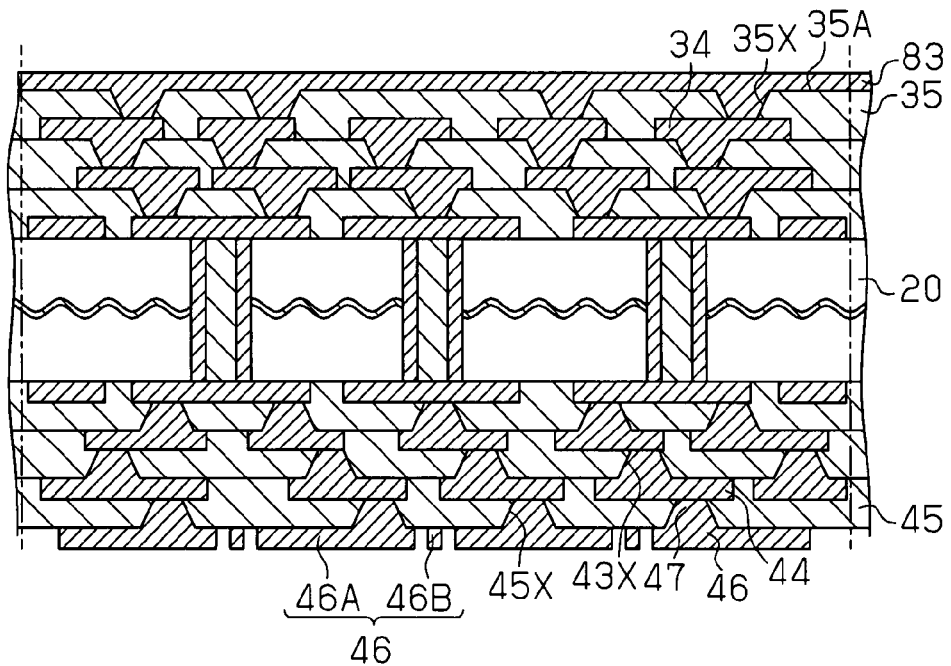

Next, in a step of FIG. 6A, the via wirings 47 are formed to fill in the through holes 45X in the insulating layer 45 and the wiring layer 46 is formed on the lower surface of the insulating layer 45. The wiring layer 46 formed at this time on the lower surface of the insulating layer 45 includes the wiring patterns 46A electrically connected to the wiring layer 44 through the via wirings 47 and the dummy patterns 46B formed in parts of regions where the wiring patterns 46A are not formed. The wiring layer 46 may be formed by any of various methods including a semiadditive process and a subtractive process.

In the step of FIG. 6A, a seed layer (not illustrated in FIG. 6A) is formed to cover the entire upper surface 35A of the insulating layer 35 including the inner surfaces of the through holes 35X. Then, electrolytic plating is performed using the seed layer as a feed layer. As an example, the seed layer is formed by electroless copper plating to cover the entire surface of the insulating layer 35. Then, electrolytic copper plating is performed using this seed layer as a feed layer to form a conductive layer 83. This fills in the through holes 35X while forming the conductive layer 83 covering the upper surface 35A of the insulating layer 35 entirely.

Figure 6B:
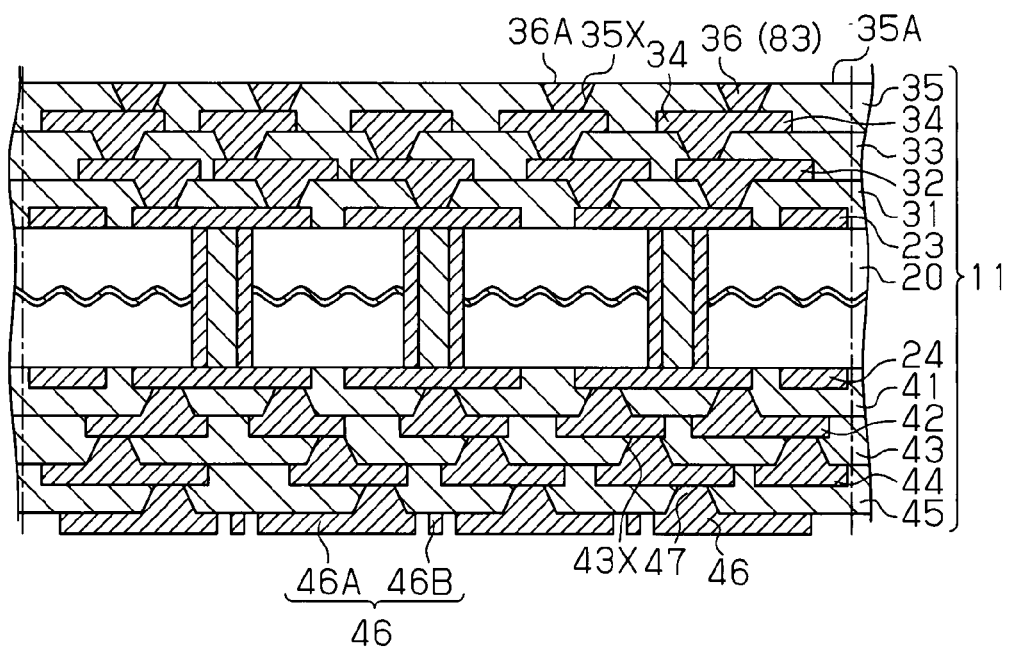

Next, in a step of FIG. 6B, the conductive layer 83 projecting from the upper surface 35A of the insulating layer 35 is polished and the roughened upper surface 35A of the insulating layer 35 is partially polished by CMP (chemical mechanical polishing), for example. This forms the via wirings 36 filling in the through holes 35X such that the upper end surfaces 36A of the via wirings 36 becomes substantially flush with the upper surface 35A of the insulating layer 35. Polishing the upper surface 35A of the insulating layer 35 partially smoothens the upper surface 35A of the insulating layer 35. As an example, the roughness of the upper surface 35A of the insulating layer 35 determined before the polishing is from about 300 to 400 nm in terms of the surface roughness Ra, whereas the roughness of the upper surface 35A of the insulating layer 35 determined after the polishing may be from about 15 to 40 nm in terms of the surface roughness Ra. In other words, in this step, the upper surface 35A of the insulating layer 35 is polished so as to be smoothened (to a level from about 15 to 40 nm in terms of the surface roughness Ra). The inner side surfaces of the through holes 35X remain roughened. Thus, the upper surface 35A of the insulating layer 35 becomes lower in surface roughness than the inner side surfaces of the through holes 35X. As a result of the polishing in this step, the upper surface 35A of the insulating layer 35 and the upper end surfaces 36A of the via wirings 36 become polished surfaces.

As a result of the aforementioned manufacturing steps, the structure corresponding to the first wiring structure 11 is manufactured.

Figure 7A:
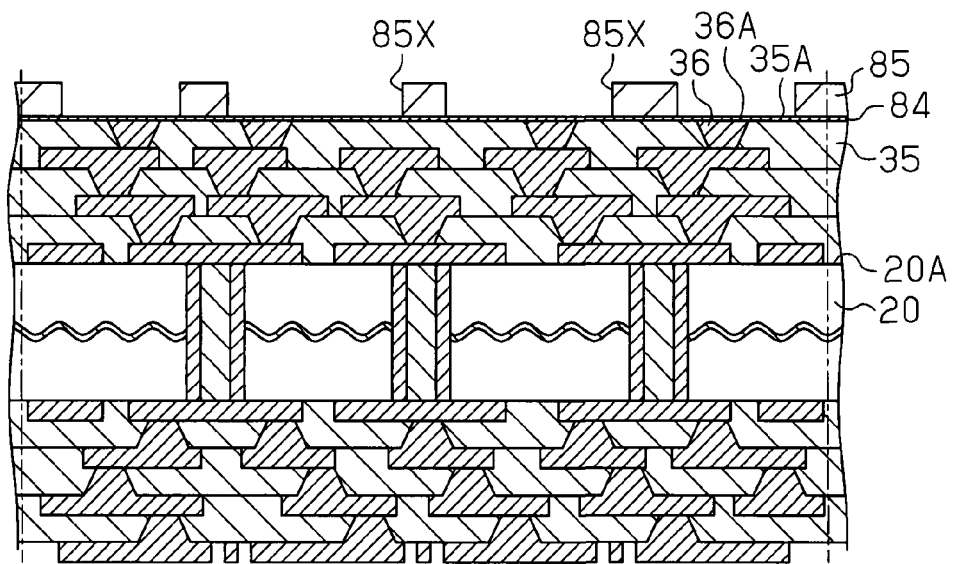

Next, in a step of FIG. 7A, a seed layer 84 is formed so as to cover the upper surface 35A of the insulating layer 35 entirely and the upper end surfaces 36A of the via wirings 36 entirely. The seed layer 84 may be formed by sputtering or electroless plating, for example. The upper surface 35A of the insulating layer 35 is a smooth surface in this step. Thus, the seed layer 84 may be formed uniformly for example by sputtering on the upper surface 35A and the upper surface of the seed layer 84 may be formed as a smooth surface. Thus, compared to forming the seed layer 84 on a roughened surface by sputtering, the resultant seed layer 84 may be thin. For forming the seed layer 84 by sputtering, for example, titanium (Ti) is deposited first by sputtering to form a Ti layer on the upper surface 35A of the insulating layer 35 and the upper end surfaces 36A of the via wirings 36 so as to cover the upper surface 35A and the upper end surfaces 36A. Then, copper is deposited by sputtering to form a Cu layer on the Ti layer. As a result, the seed layer 84 having a two-layer structure (Ti layer and Cu layer) is formed. At this time, the thickness of the Ti layer may be from about 20 to 50 nm and that of the Cu layer may be from about 100 to 300 nm, for example. Forming the Ti layer in this way as a lower surface of the seed layer 84 allows the insulating layer 35 and the seed layer 84 to contact each other more tightly. The Ti layer may be changed to a TiN layer made of titanium nitride (TiN) to form the seed layer 84 of a two-layer structure with the TiN layer and the Cu layer. Titanium and titanium nitride are metals having higher anti-corrosion resistance than copper and achieving more tight contact with the insulating layer 35 than copper. For forming the seed layer 84 by electroless plating, electroless copper plating may be adopted to form the seed layer 84 formed of a Cu layer (single-layer structure).

Before forming the seed layer 84, the upper surface 35A of the insulating layer 35 may be subjected to plasma process such as $O_2$ plasma ashing. The plasma process may roughen the upper surface 35A of the insulating layer 35. Roughing the upper surface 35A of the insulating layer 35 allows the seed layer 84 and the insulating layer 35 to contact each other more tightly. Meanwhile, reducing the roughness of the upper surface 35A of the insulating layer 35 to increase the smoothness thereof allows formation of a fine wiring on the upper surface 35A. Thus, in the plasma process, the upper surface 35A of the insulating layer 35 is roughened to an extent that does not hinder formation of a fine wiring in a subsequent step.

Next, a resist layer 85 is formed on the seed layer 84. The resist layer 85 has opening patterns 85X formed in certain positions. The opening patterns 85X are formed so as to expose the seed layer 84 in a part corresponding to a formation region for the wiring layer 50 (see FIG. 1). The resist layer 85 may be made of a material having resistance to plating in a subsequent step, for example. As an example, the resist layer 85 may be made of a photosensitive dry film resist or a liquid photoresist (such as a dry film resist or a liquid resist of a novolac resin or an acrylic resin, for example). If the photosensitive dry film resist is to be used, for example, the dry film is laminated on the upper surface of the seed layer 84 by thermal compression bonding. Then, the dry film is patterned by photolithography to form the resist layer 85. If the liquid photoresist is to be used, the resist layer 85 may be formed by the same step. The upper surface of the seed layer 84 in this step before formation of the resist layer 85 is a smooth surface, thereby suppressing the occurrence of a patterning defect in the resist layer 85. Specifically, the opening patterns 85X may be formed with a high level of accuracy.

Figure 7B:
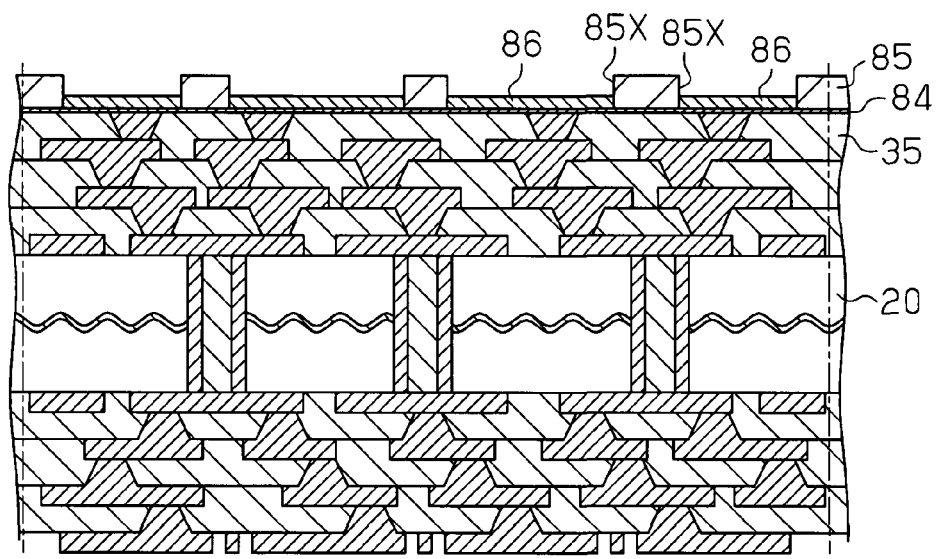

Next, in a step of FIG. 7B, with the resist layer 85 functioning as a plating mask, electrolytic plating is performed on the upper surface of the seed layer 84 using the seed layer 84 as a plating feed layer. As an example, electrolytic plating (electrolytic copper plating, for example) is performed on the upper surface of the seed layer 84 exposed from the opening patterns 85X of the resist layer 85, thereby forming a metal layer 86 (electrolytic plated metal layer) on the upper surface of the seed layer 84.

Figure 8A:
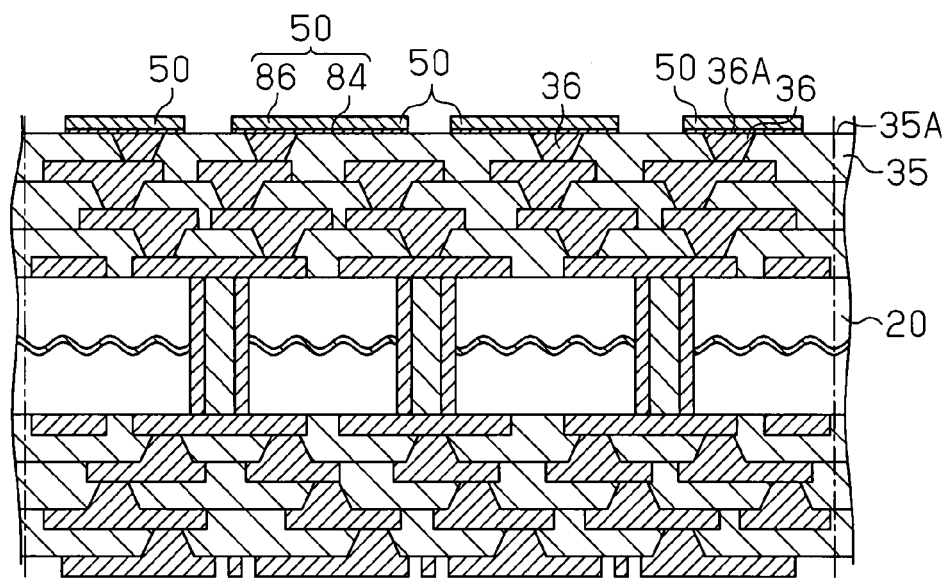
Figure 8B:
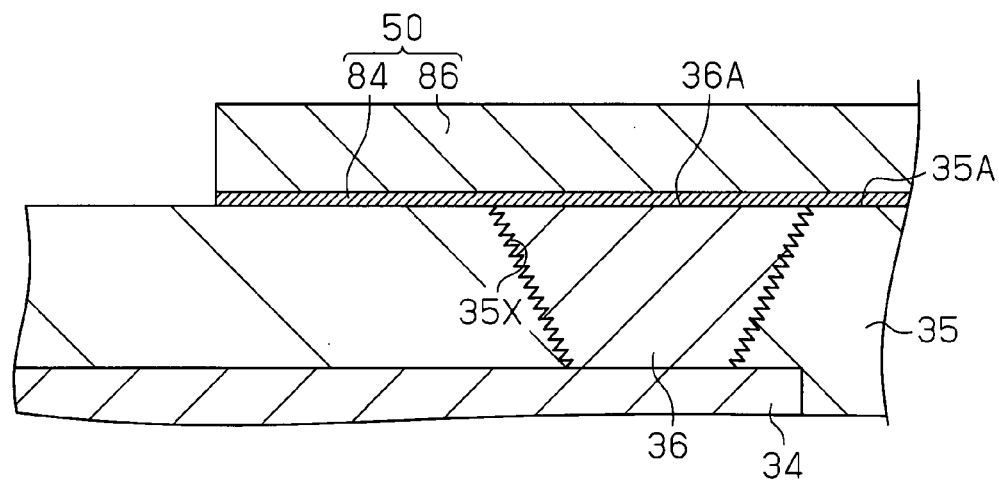

Next, the resist layer 85 is removed for example with an alkali stripping liquid. Then, using the metal layer 86 as an etching mask, unnecessary part of the seed layer 84 is removed by etching. As a result, as illustrated in FIGS. 8A and 8B, the wiring layer 50 is formed on the upper end surfaces 36A of the via wirings 36 and the upper surface 35A of the insulating layer 35. As illustrated in FIG. 8B, the wiring layer 50 is formed of the seed layer 84 bonded to the upper end surfaces 36A of the via wirings 36 and the metal layer 86 formed on the seed layer 84. In this way, the wiring layer 50 is formed by semiadditive process. The wiring layer 50 and the via wirings 36 are formed in different steps, so that they are not integral with each other.

Figure 9A:
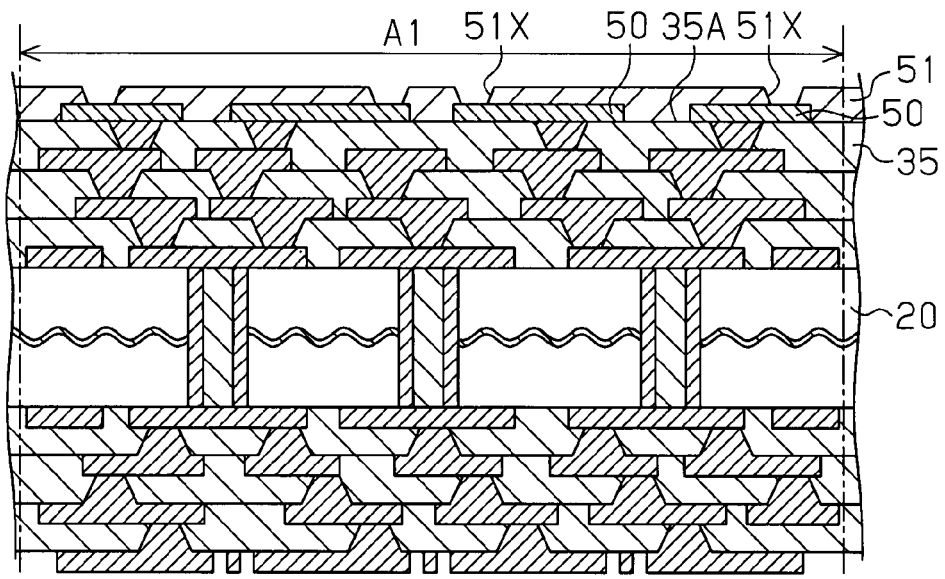

Next, in a step of FIG. 9A, the insulating layer 51 is formed on the upper surface 35A of the insulating layer 35. The insulating layer 51 has the through holes 51X through which parts of the upper surface of the wiring layer 50 are exposed. If a resin film is used to form the insulating layer 51, for example, the resin film is laminated on the upper surface 35A of the insulating layer 35 by thermal compression bonding. Then, the resin film is patterned by photolithography to form the insulating layer 51. At this time, inclusion of a void may be prevented by laminating the resin film in a vacuum atmosphere. The resin film may be a film of a photosensitive resin such as a phenolic resin or a polyimide resin, for example. If a liquid or paste insulating resin is used to form the insulating layer 51, for example, the liquid or paste insulating resin is applied onto the upper surface 35A of the insulating layer 35 by spin coating process or the like. Then, the insulating resin is patterned by photolithography to form the insulating layer 51. The liquid or paste insulating resin may be a photosensitive resin such as a phenolic resin or a polyimide resin, for example.

The roughness of the upper surface of the insulating layer 51 made of the aforementioned photosensitive resin may be from about 2 to 10 nm in terms of the surface roughness Ra, for example. Specifically, the upper surface of the insulating layer 51 is lower in surface roughness than the inner side surfaces of the through holes 35X and the upper surface 35A of the insulating layer 35.

Figure 9B:
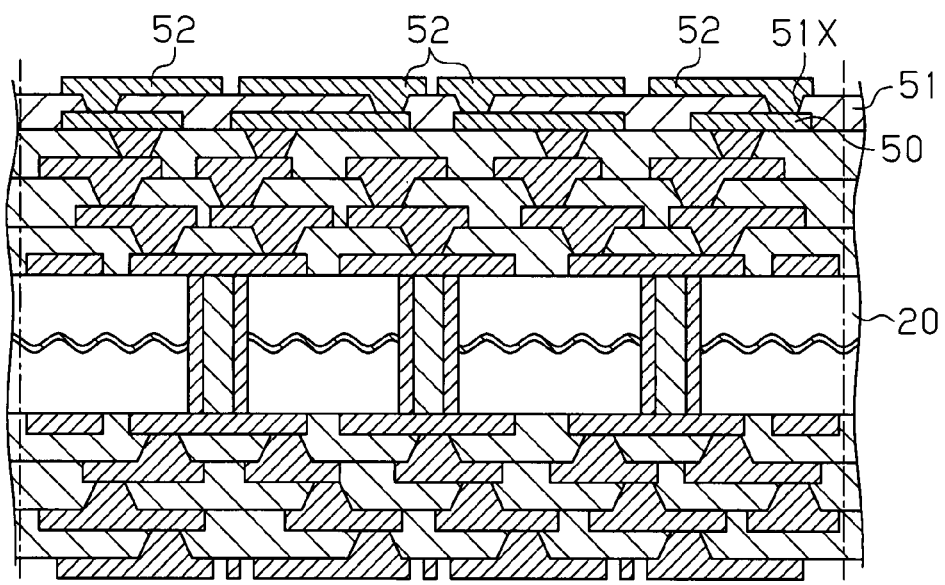

Next, in a step of FIG. 9B, the via wirings are formed to fill in the through holes 51X and the wiring layer 52 is stacked on the upper surface of the insulating layer 51 to be electrically connected through these via wirings to the wiring layer 50. At this time, as illustrated in FIG. 10B, the wiring layer 52 is formed of a seed layer 91 covering the upper surface of the insulating layer 51 existing around the through holes 51X and an electrolytic copper plated layer 92 formed on the seed layer 91. The wiring layer 52 may be formed by semiadditive process, for example. Like the seed layer 84, the seed layer 91 may be formed by sputtering or electroless plating, for example.

Figure 10A:
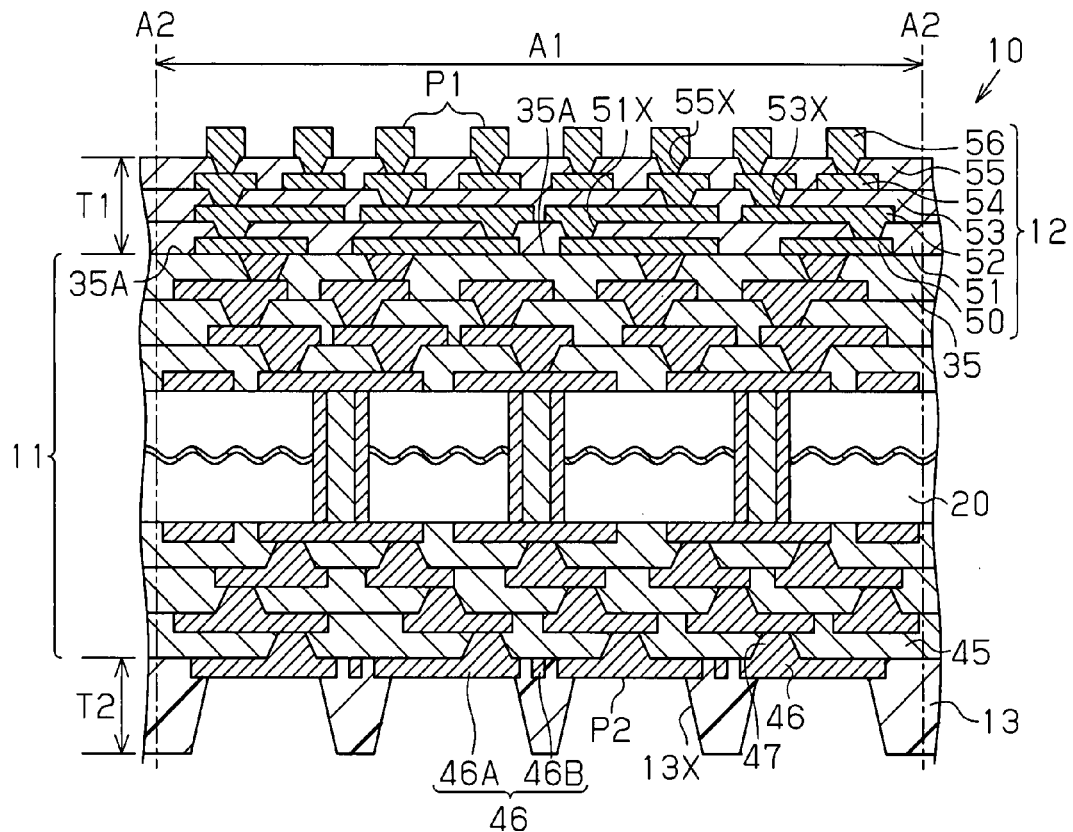
Figure 10B:
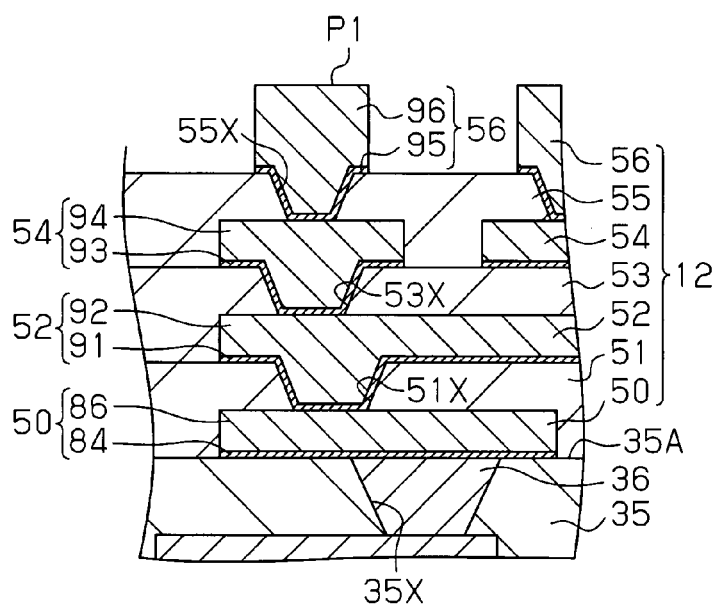

Next, in a step of FIG. 10A, like in the step of FIG. 9A, the insulating layer 53 is formed on the insulating layer 51. The insulating layer 53 has the through holes 53X through which parts of the upper surface of the wiring layer 52 are exposed. Next, like in the step of FIG. 9B, by using semiadditive process, for example, the via wirings are formed to fill in the through holes 53X and the wiring layer 54 is stacked on the upper surface of the insulating layer 53 to be electrically connected through these via wirings to the wiring layer 52. At this time, as illustrated in FIG. 10B, the wiring layer 54 is formed of a seed layer 93 covering the upper surface of the insulating layer 53 existing around the through holes 53X and an electrolytic copper plated layer 94 formed on the seed layer 93. Like the seed layer 84, the seed layer 93 may be formed by sputtering or electroless plating, for example.

Next, like in the step of FIG. 9A, the insulating layer 55 is formed on the insulating layer 53. The insulating layer 55 has the through holes 55X through which parts of the upper surface of the wiring layer 54 are exposed. Next, like in the step of FIG. 9B, by using semiadditive process, for example, the via wirings are formed to fill in the through holes 55X and the wiring layer 56 is stacked on the upper surface of the insulating layer 55 to be electrically connected through these via wirings to the wiring layer 54. At this time, the wiring layer 56 is formed of a seed layer 95 covering the upper surface of the insulating layer 55 existing around the through holes 55X and an electrolytic copper plated layer 96 formed on the seed layer 95. Where necessary, surface-treated layers may be formed on surfaces of the pads P1 of the wiring layer 56. Like the seed layer 84, the seed layer 95 may be formed by sputtering or electroless plating, for example.

As a result of the aforementioned manufacturing steps, the second wiring structure 12 may be stacked on the upper surface 35A of the insulating layer 35 in the top layer of the first wiring structure 11. At this time, the volume V1 of the wiring layers 50, 52, 54, and 56 in the entire second wiring structure 12 is set to be substantially the same as the volume V2 of the bottom wiring layer 46 in the first wiring structure 11.

In the step of FIG. 10A, the solder resist layer 13 is stacked on the lower surface of the insulating layer 45. The solder resist layer 13 has the openings 13X through which the external connection pads P2 are exposed that are defined in intended parts of the wiring patterns 46A in the bottom layer of the first wiring structure 11. At this time, the thickness T2 of the solder resist layer 13 (thickness from the lower surface of the insulating layer 45 to the lower surface of the solder resist layer 13) is set to be equal to or greater than the thickness T1 of the second wiring structure 12 (thickness from the upper surface 35A of the insulating layer 35 to the upper surface of the insulating layer 55). The solder resist layer 13 is made of a photosensitive phenolic resin or polyimide resin, for example. The solder resist layer 13 may be formed by laminating a photosensitive solder resist film or applying a liquid solder resist and then patterning the resist into an intended shape, for example. As a result, parts of the wiring patterns 46A are exposed as the external connection pads P2 through the openings 13X in the solder resist layer 13.

Where necessary, a surface-treated layer may be formed on each external connection pad P2. The solder resist layer 13 may be formed at any time after formation of the bottom wiring layer 46. As an example, the solder resist layer 13 may be formed after the step of FIG. 6A.

As a result of the aforementioned manufacturing steps, the structure corresponding to the wiring substrate 10 is manufactured in each region A1.

Next, the structure illustrated in FIG. 10A is cut along a cutting line A2 with a slicer or the like to form multiple wiring substrates 10 as individual pieces.

A method of manufacturing the semiconductor device 60 is described next by referring to FIG. 11.

Figure 11:
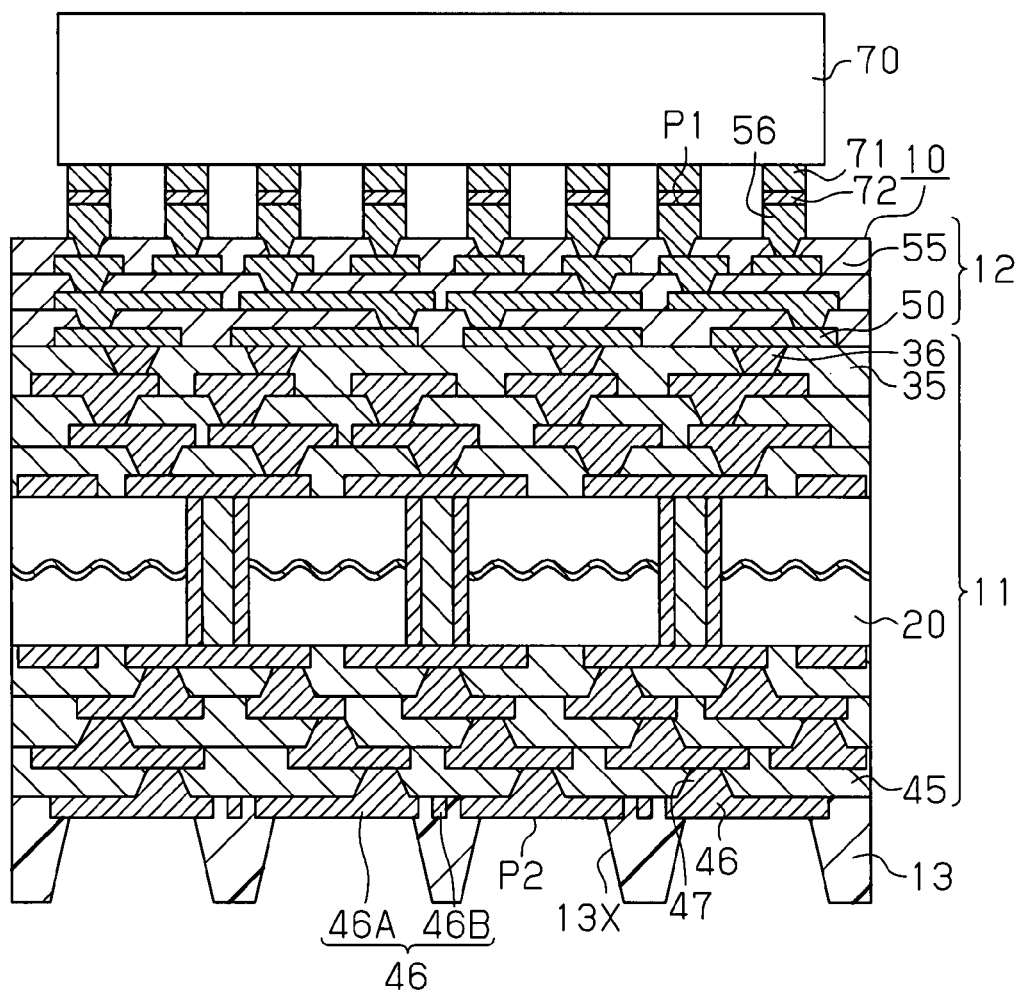
FIG. 11 is a diagrammatic sectional view illustrating a method of manufacturing the semiconductor device according to the first embodiment.

In a step of FIG. 11, the semiconductor chip 70 with the columnar connection terminals 71 is prepared. The connection terminals 71 may be manufactured by a known method, so that the manufacture thereof is not described in detail by referring to the drawings. The connection terminals 71 are manufactured by the following method, for example.

First, a protective film with openings through which electrode pads are to be exposed is formed on the circuit formation surface (lower surface, for example) of the semiconductor chip 70. Then, a seed layer is formed so as to cover the lower surface of the protective film and the electrode pads. Next, a resist layer is formed from which the seed layer (the seed layer covering the lower surfaces of the electrode pads) is exposed in parts corresponding to formation regions for the connection terminals 71. Then, the seed layer exposed from the resist layer is subjected to electrolytic plating (electrolytic copper plating, for example) using this seed layer as a feed layer, thereby forming the columnar connection terminals 71 on the electrode pads.

Next, the bonding members 72 are formed on the lower surfaces of the connection terminals 71. The bonding members 72 may be formed by depositing solder so as to cover the lower surfaces of the connection terminals 71 by electrolytic solder plating using the resist layer as a plating mask and the seed layer as a plating feed layer, for example. Then, unnecessary part of the seed layer and that of the resist layer are removed.

Next, the connection terminals 71 of the semiconductor chip 70 are flip-chip bonded onto the pads P1 of the wiring substrate 10. As an example, the wiring substrate 10 and the semiconductor chip 70 are placed in their positions and then the bonding members 72 (solder-plated layer) are melted by reflow process, thereby electrically connecting the connection terminals 71 to the pads P1.

Next, the underfill resin 75 (see FIG. 3) is provided to fill in a gap between the flip-chip bonded semiconductor chip 70 and wiring substrate 10 and is then cured. The semiconductor device 60 illustrated in FIG. 3 may be manufactured as result of the aforementioned manufacturing steps.

The first embodiment achieves the following advantages.

(1) The wiring substrate 10 has the first wiring structure 11 where insulating layers and wiring layers are both formed substantially vertically symmetric relative to the core substrate 20. The wiring substrate 10 has the second wiring structure 12 stacked on the upper surface of the first wiring structure 11 and including multiple wiring layers and multiple insulating layers, and the solder resist layer 13 formed on the lower surface of the first wiring structure 11. The wiring substrate 10 is vertically asymmetric relative to the first wiring structure 11. As an example, the wiring patterns 46A where the external connection pads P2 are formed are low-density wirings. This causes a difference in a wiring density between the wiring patterns 46A and the second wiring structure 12, thereby causing the vertical asymmetry relative to the first wiring structure 11. In this regard, the wiring substrate 10 might suffer from warp easily.

Meanwhile, in the wiring substrate 10 of this embodiment, the volume V2 of the wiring layer 46 stacked on the bottom insulating layer 45 in the first wiring structure 11 is set to be substantially the same as the volume V1 of the wiring layers 50, 52, 54, and 56 stacked on the upper surface 35A of the top insulating layer 35 in the first wiring structure 11. As a result, a difference in a wiring density may be reduced between a side below the bottom insulating layer 45 and a side above the top insulating layer 35. This achieves a favorable balance in a physical value (such as a coefficient of thermal expansion or a coefficient of elasticity) between the upper and lower sides of the core substrate 20. Specifically, a distribution of the physical value determined relative to the core substrate 20 becomes substantially symmetric in the vertical direction (thickness direction). This may appropriately suppress the occurrence of warp or undulations of the wiring substrate 10.

(2) The occurrence of warp or undulations of the wiring substrate 10 causes stress at an interface between the insulating layer 35 containing a thermosetting resin as the major component thereof and the insulating layer 51 containing a photosensitive resin as the major component thereof. If the upper surface 35A of the insulating layer 35 is smoothened so that the insulating layers 35 and 51 do not contact each other tightly, this stress may make the insulating layer 51 detached from the insulating layer 35 easily. In contrast, the occurrence of warp or undulations of the wiring substrate 10 may be suppressed in this example, making it possible to prevent the insulating layer 51 from coming off the insulating layer 35 appropriately.

(3) The wiring layer 46 has the wiring patterns 46A and the dummy patterns 46B. The low wiring density of the wiring patterns 46A makes it possible to easily reverse regions for the dummy patterns 46B.

(4) The thickness T2 of the solder resist layer 13 is equal to or greater than the thickness T1 corresponding to the total of the thicknesses of all the insulating layers in the second wiring structure 12. As a result, a distribution of the physical value of the wiring substrate 10 as viewed in the vertical direction (thickness direction) thereof may become substantially symmetric relative to the core substrate 20. This achieves a favorable balance in the physical value between the upper and lower sides of the core substrate 20, thereby appropriately suppressing warp or deformation of the wiring substrate 10 to be caused by thermal shrinkage, for example.

(5) The inner side surfaces of the through holes 35X formed in the insulating layer 35 are roughened. This may increase a contact area between the via wirings 36 and the insulating layer 35, compared to the case where the inner side surfaces of the through holes 35X are smoothened. This allows the via wirings 36 and the insulating layer 35 to contact each other more tightly, thereby providing higher resistance to pulling force caused as a result of a difference in a coefficient of linear expansion between the via wirings 36 and the insulating layer 35. As a result, the via wirings 36 and the insulating layer 35 may be connected more reliably and the via wirings 36 may be prevented from coming off the through holes 35X.

(6) The upper surface 35A of the insulating layer 35 is smoother than the inner side surfaces of the through holes 35X in the insulating layer 35. This makes it possible to form a metal film (such as the seed layer 84) uniformly on the upper surface 35A of the insulating layer 35 for example by sputtering. The seed layer 84 formed in this way may be thinner than the seed layer 84 formed on a roughened surface. Additionally, the upper surface 35A of the insulating layer 35 formed as a smooth surface with not many irregularities may suppress the occurrence of a residue during removing the seed layer 84 by etching, compared to the upper surface 35A formed as a roughened surface with many irregularities. This may easily responsive to a trend toward making a wiring layer finer to be stacked on the upper surface 35A of the insulating layer 35.

A second embodiment is described below by referring to FIGS. 12 to 15. A wiring substrate 10A of the second embodiment differs from that of the first embodiment in that a first wiring takes the place of the first wiring structure 11. Members same as those illustrated in FIGS. 1 to 11 referred to previously are identified by the same signs and will not be described in detail.

Figure 12:
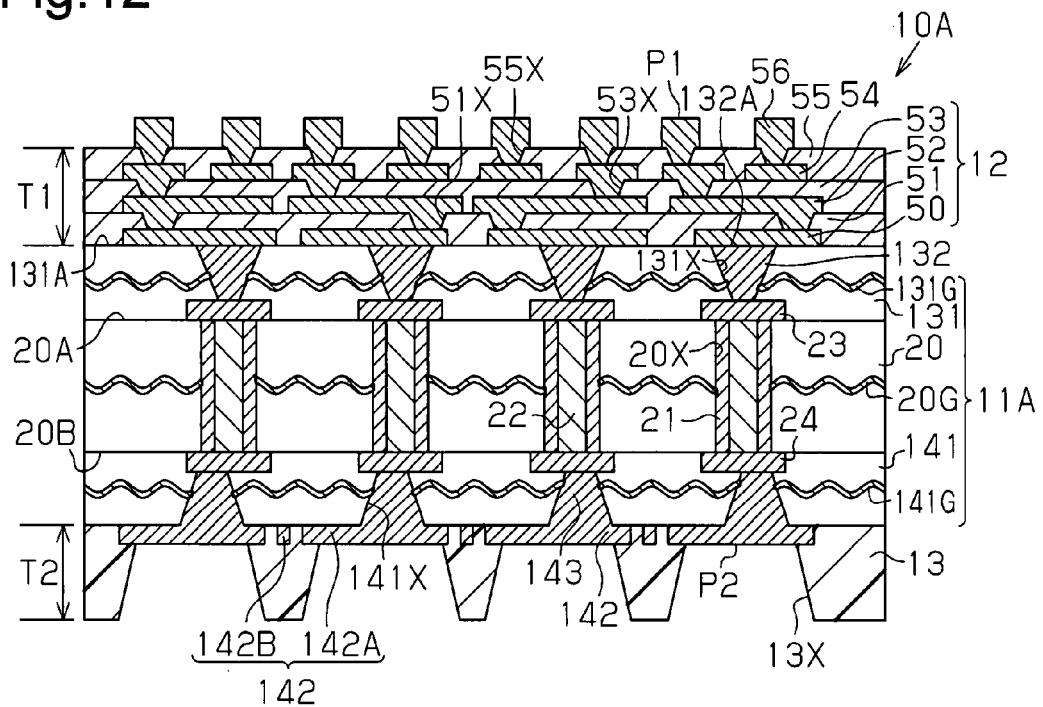
FIG. 12 is a diagrammatic sectional view of a wiring substrate according to a second embodiment.

As illustrated in FIG. 12, the wiring substrate 10A includes the first wiring structure 11A, the second wiring structure 12 stacked on the upper surface of the first wiring structure 11A, and the solder resist layer 13 stacked on the lower surface of the first wiring structure 11A. The wiring substrate 10A may be formed into any planar shape and any size. As an example, the planar shape of the wiring substrate 10A may be a square of from about 20 mm×20 mm to about 40 mm×40 mm.

The first wiring structure 11A is a low-density wiring layer with wiring layers of a density lower than those of the second wiring structure 12. The first wiring structure 11A includes the core substrate 20, an insulating layer 131 and via wirings 132 stacked on the upper surface 20A of the core substrate 20, and an insulating layer 141 and a wiring layer 142 stacked on the lower surface 20B of the core substrate 20.

The insulating layers 131 and 141 are insulating layers with a reinforcing material having high mechanical strength (such as stiffness or hardness). As an example, the insulating layers 131 and 141 are higher in mechanical strength than the insulating layers 51, 53, and 55 in the second wiring structure 12. As an example, the insulating layers 131 and 141 may be made of a material that is what is called a glass epoxy resin formed by impregnating glass cloth as the reinforcing material with a thermosetting insulating resin containing an epoxy resin as the major component thereof and curing the resin. The insulating layer 131 has glass cloth 131G of an intended number (in FIG. 12, one). The insulating layer 141 has glass cloth 141G of an intended number (in FIG. 12, one). The glass cloth 131G and the glass cloth 141G have the same structure as the glass cloth 20G. The reinforcing material is not limited to the glass cloth 131G and the glass cloth 14G but it may also be woven fabric or non-woven fabric using a carbon fiber bundle, a polyester fiber bundle, a nylon fiber bundle, an aramid fiber bundle, or a liquid crystal polymer fiber bundle, for example. The thermosetting insulating resin is not limited to the epoxy resin but it may also be a resin material such as a polyimide resin or a cyanate resin, for example.

The insulating layer 131 is stacked on the upper surface 20A of the core substrate 20 so as to cover the wiring layer 23. The insulating layer 131 is set to be thinner than the core substrate 20, for example. The thickness of the insulating layer 131 may be from about 40 to 75 μm, for example.

The insulating layer 131 is provided with through holes 131X forming openings in intended positions of an upper surface 131A of the insulating layer 131 while passing through the insulating layer 131 in the thickness direction thereof to expose the upper surface of the wiring layer 23 partially. The through holes 131X are each formed into a tapered shape that becomes greater in a diameter from a lower side (side near the core substrate 20) toward an upper side (side near the second wiring structure 12) of FIG. 12. As an example, the through holes 131X are each formed as an inverted truncated cone with a lower opening end of a diameter smaller than that of an upper opening end thereof. The diameter of the upper opening end of the through holes 131X may be from about 50 to 70 μm, for example.

The through holes 131X cut the glass cloth 131G. End portions of the glass cloth 131G where the glass cloth 131G is cut project from the side walls of the through holes 131X toward the insides of the through holes 131X, for example.

The upper surface 131A of the insulating layer 131 is a smooth surface (low-roughness surface) with not many irregularities. As an example, the upper surface 131A of the insulating layer 131 is lower in surface roughness than the inner side surfaces of the through holes 131X. The roughness of the upper surface 131A of the insulating layer 131 is set to be from about 15 to 40 nm in terms of the surface roughness Ra, for example. The roughness of the inner side surfaces of the through holes 131X is set to be from about 300 to 400 nm in terms of the surface roughness Ra, for example.

Via wirings 132 electrically connected to the wiring layer 23 are formed in the through holes 131X. The via wirings 132 are formed so as to pass through the insulating layer 131 in the thickness direction thereof. The via wirings 132 fill in the through holes 131X, for example. Thus, the via wirings 132 are formed to have the same shape as that of the through holes 131X. The via wirings 132 may be made of copper or a copper alloy, for example.

The via wirings 132 are formed so as to cover the entire end portions of the glass cloth 131G projecting from the side walls of the through holes 131X inside the through holes 131X.

The second wiring structure 12 is stacked on the upper surface 131A of the insulating layer 131 and upper end surfaces 132A of the via wirings 132. As an example, the wiring layer 50 in the second wiring structure 12 is stacked on the upper surface 131A of the insulating layer 131 so as to be connected to the upper end surfaces 132A of the via wirings 132.

An insulating layer 141 and a wiring layer 142 are stacked in this order on the lower surface 20B of the core substrate 20. The insulating layer 141 is stacked on the lower surface 20B of the core substrate 20 so as to cover the wiring layer 24. The insulating layer 141 is set to be thinner than the core substrate 20, for example. The thickness of the insulating layer 141 may be from about 40 to 75 μm, for example.

The insulating layer 141 is provided with through holes 141X in intended positions that pass through the insulating layer 141 in the thickness direction thereof. The through holes 141X are each formed into a tapered shape that becomes greater in a diameter from an upper side (side near the core substrate 20) toward a lower side (side near the solder resist layer 13) of FIG. 12. As an example, the through holes 141X are each formed as a truncated cone with a lower opening end of a diameter larger than that of an upper opening end thereof. The diameter of the lower opening end of the through holes 141X may be from about 50 to 70 μm, for example.

The through holes 141X cut the glass cloth 141G. End portions of the glass cloth 141G where the glass cloth 141G is cut project from the side walls of the through holes 141X toward the insides of the through holes 141X, for example.

The wiring layer 142 is a bottom wiring layer stacked on the lower surface of the bottom insulating layer 141 in the first wiring structure 11A. The wiring layer 142 is partially connected to the wiring layer 24 electrically through via wirings 143 formed in the through holes 141X. The via wirings 143 fill in the through holes 141X, for example. Thus, the via wirings 143 are formed to have the same shape as that of the through holes 141X.

The wiring layer 142 for example has wiring patterns 142A formed integrally with the via wirings 143 and electrically connected to the wiring layer 24 through the via wirings 143, and dummy patterns 142B formed in parts of regions where the wiring patterns 142A are not formed. The dummy patterns 142B are formed in the same way as the dummy patterns 46B of the first embodiment.

The wiring layer 142 (wiring patterns 142A and dummy patterns 142B) and the via wirings 143 may be made of copper or a copper alloy, for example.

A volume V2 of the bottom wiring layer 142 (wiring patterns 142A and dummy patterns 142B) in the first wiring structure 11A is set to be substantially the same as a volume V1 of the wiring layers 50, 52, 54, and 56 in the entire second wiring structure 12. As an example, a volume ratio V1/V2 is set to fall in a range from 0.8 to 1.5.

The solder resist layer 13 is formed on the lower surface of the insulating layer 141 formed in the bottom layer of the first wiring structure 11A so as to cover the bottom wiring layer 142. Parts of the lower surface of the wiring layer 142 (wiring patterns 142A, for example) are exposed as the external connection pads P2 through the openings 13X in the solder resist layer 13.

A method of manufacturing the wiring substrate 10A is described next. The manufacturing method described below is a multi-piece manufacturing method, which first prepares a block including multiple parts serving as the wiring substrates 10A and then cuts the block to singulate a large number of wiring substrates 10A.

Figure 13A:
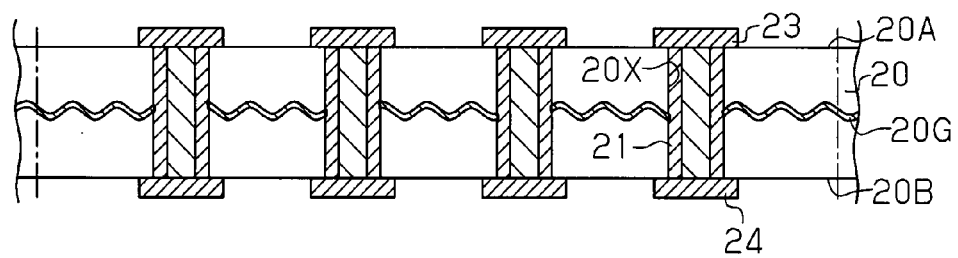
FIGS. 13A, 13B, 14A to 14C, and 15 are diagrammatic sectional views illustrating a method of manufacturing the wiring substrate according to the second embodiment.

First, in a step of FIG. 13A, like in the steps of FIGS. 4A to 4C, the wiring layers 23 and 24 are formed on the upper surface 20A and the lower surface 20B of the core substrate 20 respectively.

Figure 13B:
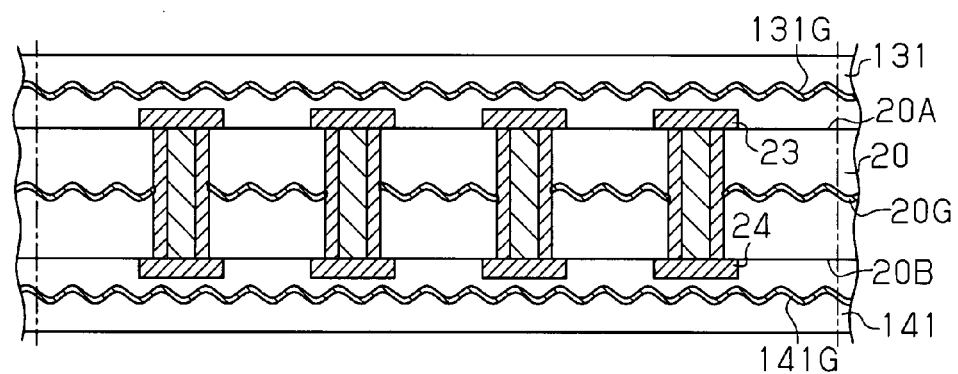

Next, in a step of FIG. 13B, the insulating layer 131 is formed to cover the upper surface 20A of the core substrate 20 and the wiring layer 23. Further, the insulating layer 141 is formed to cover the lower surface 20B of the core substrate 20 and the wiring layer 24. The insulating layer 131 and 141 may be formed by laminating resin films on the core substrate 20 and then processing the resin films under heat at a temperature from about 130 to 200 degree Celsius while pressing the resin films, thereby curing the resin films. The resin films to be used may formed by impregnating glass cloth as a reinforcing material with a thermosetting resin such as an epoxy resin.

Figure 14A:
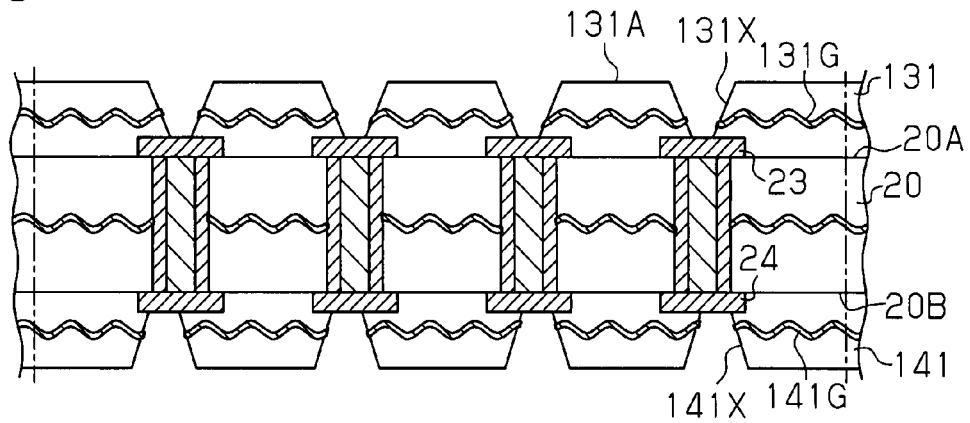

Next, in a step of FIG. 14A, the through holes 131X are formed in certain positions of the insulating layer 131 so as to expose parts of the upper surface of the wiring layer 23. Further, the through holes 141X are formed in certain positions of the insulating layer 141 so as to expose parts of the lower surface of the wiring layer 24. The through holes 131X and the through holes 141X may be formed by laser processing with a $CO_2$ laser or an UV-YAG laser, for example. If the through holes 131X are formed by laser processing, the end portions of the glass cloth 131G cut with the laser project from the side walls of the through holes 131X. This makes surface roughness larger in parts where the glass cloth 131G exists than in resin parts (specifically, resin layers forming the side walls of the through holes 131X). Likewise, if the through holes 141X are formed by laser processing, the end portions of the glass cloth 141G cut with the laser project from the side walls of the through holes 141X.

If the through holes 131X and the through holes 141X are formed by laser processing, desmear process is performed subsequently to remove smears of resin attached to surfaces of the wiring layers 23 and 24 exposed at the bottoms of the through holes 131X and the through holes 141X. This desmear process roughens the inner side surfaces of the through holes 131X, the upper surface 131A of the insulating layer 131, the inner side surfaces of the through holes 141X, and the lower surface of the insulating layer 141.

Figure 14B:
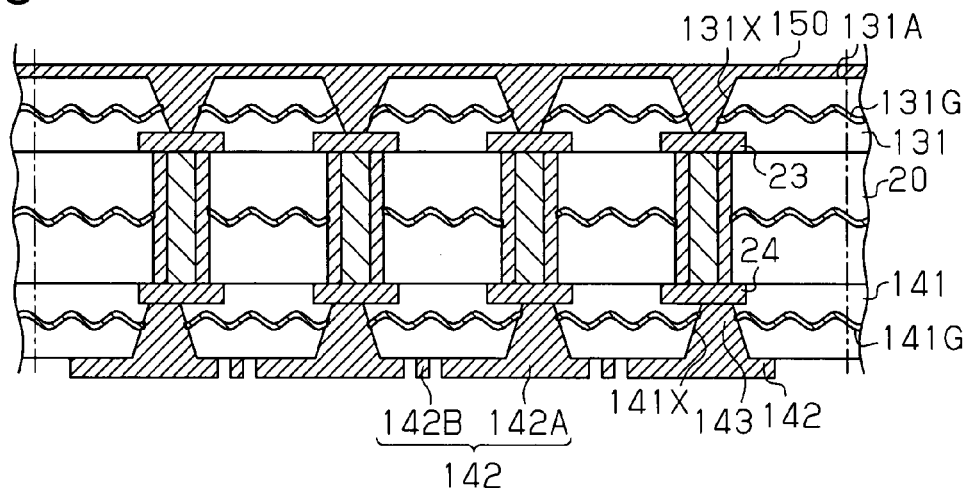

Next, in a step of FIG. 14B, the via wirings 143 are formed to fill in the through holes 141X in the insulating layer 141 and the wiring layer 142 is formed on the lower surface of the insulating layer 141 like in the step of FIG. 6A. At this time, the via wirings 143 are formed so as to cover the entire end portions of the glass cloth 141G projecting from the side walls of the through holes 141X. This makes the end portions of the glass cloth 141G projecting from the side walls of the through holes 141X penetrate into the via wirings 143. As a result of this step, the wiring patterns 142A are formed on the lower surface of the insulating layer 141 to be electrically connected to the wiring layer 24 through the via wirings 143 and the dummy patterns 142B are formed in regions where the wiring patterns 142A are not arranged.

In the step of FIG. 14B, a seed layer (not illustrated in FIG. 14B) is formed to cover the entire upper surface 131A of the insulating layer 131 including the inner surfaces of the through holes 131X and the entire upper surface of the wiring layer 23 exposed through the through holes 131X. Then, electrolytic plating is performed using this seed layer as a feed layer, thereby forming a conductive layer 150 filing in the through holes 131X and covering the entire upper surface 131A of the insulating layer 131.

Figure 14C:
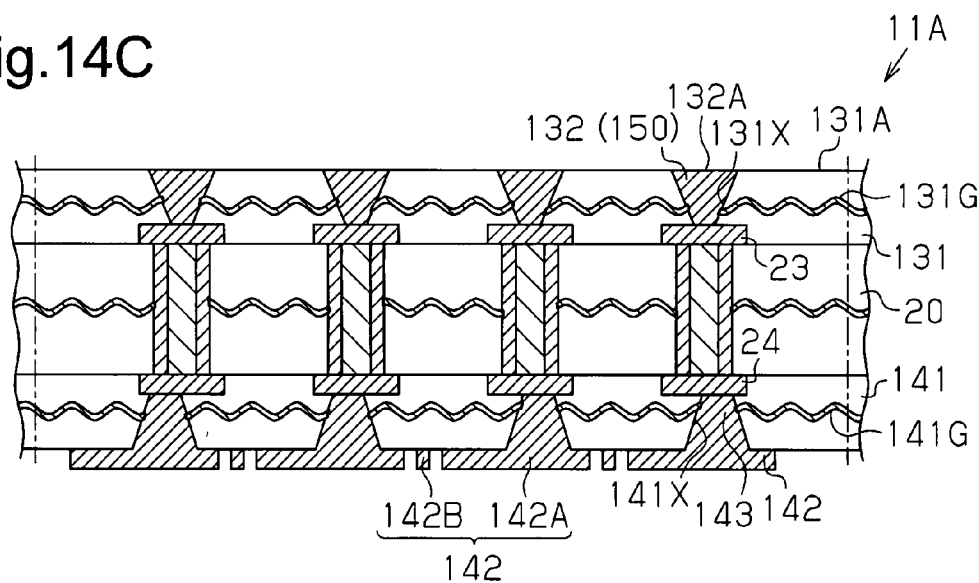

Next, in a step of FIG. 14C, the conductive layer 150 projecting from the upper surface 131A of the insulating layer 131 is polished and the roughened upper surface 131A of the insulating layer 131 is partially polished by CMP, for example. This forms the via wirings 132 filling in the through holes 131X such that the upper end surfaces 132A of the via wirings 132 becomes substantially flush with the upper surface 131A of the insulating layer 131. At this time, the via wirings 132 are formed so as to cover the entire end portions of the glass cloth 131G projecting from the side walls of the through holes 131X. This makes the end portions of the glass cloth 131G projecting from the side walls of the through holes 131X penetrate into the via wirings 132. In this step, the upper surface 131A of the insulating layer 131 is smoothened by being polished partially.

The first wiring structure 11A may be manufactured by the aforementioned manufacturing steps.

Figure 15:
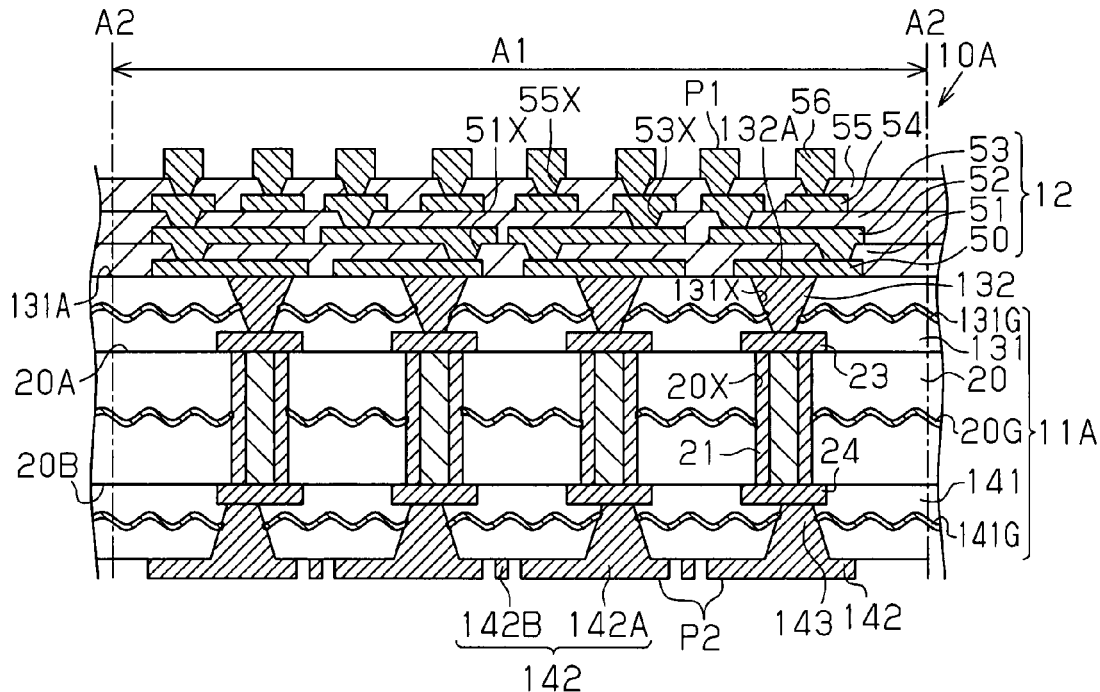

Next, in a step of FIG. 15, like in the steps of FIGS. 7 to 10, the multiple wiring layers 50, 52, 54, and 56, and the multiple insulating layers 51, 53, and 55 are stacked on the upper surface of the first wiring structure 11A, specifically on the upper surface 131A of the insulating layer 131 and the upper end surfaces 132A of the via wirings 132 such that the wiring layers and the insulating layers are arranged alternately. As a result, the second wiring structure 12 is stacked on the upper surface of the first wiring structure 11A. Then, the solder resist layer 13 is stacked on the lower surface of the first wiring structure 11A, specifically on the lower surface of the insulating layer 141. The solder resist layer 13 has the openings 13X through which the external connection pads P2 are exposed that are defined in intended parts of the wiring patterns 142A in the bottom layer (see FIG. 12).

As a result of the aforementioned manufacturing steps, a structure corresponding to the wiring substrate 10A is manufactured in each region A1.

The second embodiment achieves the following advantage in addition to the advantages (1) to (6) of the first embodiment.

(7) The insulating layers 131 and 141 made of an insulating resin with a reinforcing material are formed on the upper and lower surfaces of the core substrate 20 respectively. As described below, the mechanical strength of the insulating layers 131 and 141 may compensate for reduction in the mechanical strength of the core substrate 20 caused by thickness reduction of the core substrate 20.

The diameter of the through holes 20X in the core substrate 20 is from about 100 to 200 μm, whereas the diameter of the through holes 131X and the through holes 141X formed in the insulating layers 131 and 141 respectively with a reinforcing material is about 50 to 70 μm. Specifically, the through holes 131X and the through holes 141X are formed to be smaller in a diameter than the through holes 20X. If the through holes 20X and the through holes 131X (or through holes 141X) of the same number are formed, the amount of the glass cloth 131G in the insulating layer 131 (or the amount of the glass cloth 141G in the insulating layer 141) cut off by the through holes 131X (or the through holes 141X) becomes smaller than that of the glass cloth 20G in the core substrate 20 cut off by the through holes 20X. This reserves a wide area to be occupied by the glass cloth 20G, the glass cloth 131G, and the glass cloth 141G as reinforcing materials. Thus, where the core substrate 20 is reduced in a thickness and the insulating layers 131 and 141 smaller in a thickness than this reduction are stacked on the upper and lower surfaces of the core substrate 20 respectively, the presence of the glass cloth 13G and the glass cloth 141G in the insulating layers 131 and 141 maintains the stiffness of the wiring substrate 10A at a sufficient level. This allows thickness reduction of the entire wiring substrate 10A while suppressing the occurrence of warp or undulations of the wiring substrate 10A appropriately.

A third embodiment is described below by referring to FIG. 16. A wiring substrate 10B of the third embodiment differs from that of the first embodiment in that a first wiring structure 11B takes the place of the first wiring structure 11.

The following description is mainly intended for the difference from the first embodiment. Members same as those illustrated in FIGS. 1 to 15 are identified by the same signs and will not be described in detail.

Figure 16:
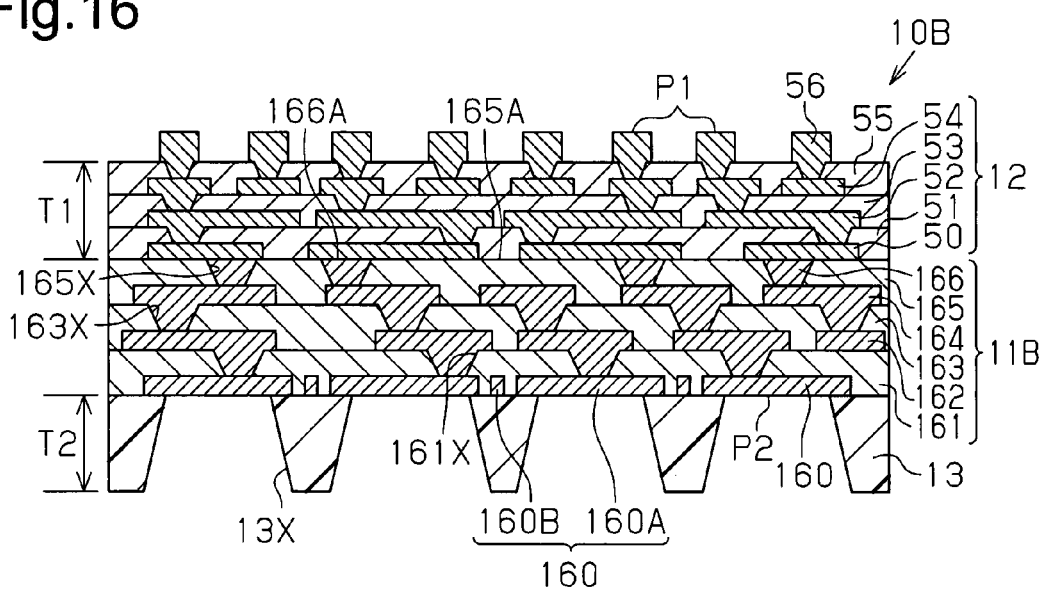
FIG. 16 is a diagrammatic sectional view of a wiring substrate according to a third embodiment.

As illustrated in FIG. 16, the first wiring structure 11B does not have the core substrate 20. The first wiring structure 11B is a low-density wiring layer with wiring layers of a density lower than those of the second wiring structure 12. The first wiring structure 11B includes a wiring layer 160, an insulating layer 161, a wiring layer 162, an insulating layer 163, a wiring layer 164, an insulating layer 165, and via wirings 166 stacked in this order. The insulating layers 161, 163, and 165 may be made of a thermosetting insulating resin containing an insulating resin such as an epoxy resin or a polyimide resin as the major component thereof, for example. The insulating layers 161, 163, and 165 may contain a filler such as silica or alumina, for example. The wiring layers 162 and 164, and the via wirings 166 may be made of copper or a copper alloy, for example. The thickness of the insulating layers 161, 163, and 165 may be from about 20 to 45 μm, for example. The thickness of the wiring layers 160, 162, and 164 may be from about 15 to 35 μm, for example. The line and space (L/S) of the wiring layers 160, 162, and 164 may be about 20 μm/20 μm, for example.

The wiring layer 160 is a bottom wiring layer in the first wiring structure 11B. The lower surface of the wiring layer 160 is exposed from the insulating layer 161. The lower surface of the wiring layer 160 is formed to be substantially flush with the lower surface of the insulating layer 161, for example. As an example, the wiring layer 160 may be formed of a stack of a first metal layer (Cu layer, for example) and a second metal layer (including an Ni layer and an Au layer, for example). The wiring layer 160 of this structure is formed such that the Au layer is exposed from the insulating layer 161.

The wiring layer 160 for example has wiring patterns 160A electrically connected to the wiring layer 162 directly above the wiring layer 160, and dummy patterns 160B formed in parts of regions where the wiring patterns 160A are not formed. The dummy patterns 160B are formed in the same way as the dummy patterns 46B of the first embodiment.

A volume V2 of the bottom wiring layer 160 (wiring patterns 160A and dummy patterns 160B) in the first wiring structure 11B is set to be substantially the same as a volume V1 of the wiring layers 50, 52, 54, and 56 in the entire second wiring structure 12. As an example, a volume ratio V1/V2 is set to fall in a range from 0.8 to 1.5.

The insulating layer 161 is formed so as to cover the upper surface and a side surface of the wiring layer 160 and to expose the lower surface of the wiring layer 160. The insulating layer 161 is provided with through holes 161X in intended positions. The through holes 161X pass through the insulating layer 161 in the thickness direction thereof to expose the upper surface of the wiring layer 160 (upper surfaces of the wiring patterns 160A, for example).

The wiring layer 162 is stacked on the upper surface of the insulating layer 161. The wiring layer 162 is electrically connected to the wiring layer 160 (wiring patterns 160A, for example) through via wirings filling in the through holes 161X. The wiring layer 162 is formed integrally with the via wirings filling in the through holes 161X, for example.

The insulating layer 163 is formed on the upper surface of the insulating layer 161 so as to cover the wiring layer 162. The insulating layer 163 is provided with through holes 163X in intended positions. The through holes 163X pass through the insulating layer 163 in the thickness direction thereof to expose the upper surface of the wiring layer 162.

The wiring layer 164 is stacked on the upper surface of the insulating layer 163. The wiring layer 164 is electrically connected to the wiring layer 162 through via wirings filling in the through holes 163X. The wiring layer 164 is formed integrally with the via wirings filling in the through holes 163X, for example.

The insulating layer 165 is formed on the upper surface of the insulating layer 163 so as to cover the wiring layer 164. The insulating layer 165 is provided with through holes 165X in intended positions. The through holes 165X pass through the insulating layer 165 in the thickness direction thereof to expose the upper surface of the wiring layer 164.

The through holes 161X, the through holes 163X, and the through holes 165X are each formed into a tapered shape that becomes greater in a diameter from a lower side (side near the solder resist layer 13) toward an upper side (side near the second wiring structure 12) of FIG. 16. As an example, the through holes 161X, the through holes 163X, and through holes 165X are each formed as an inverted truncated cone with an upper opening end of a diameter larger than that of a lower opening end thereof. In this way, all the through holes 161X, the through holes 163X, and the through holes 165X in the first wiring structure 11B are each formed into a tapered shape with an opening on a side near the second wiring structure 12 larger than an opening on a side near the solder resist layer 13. The diameter of the upper opening end of the through holes 161X, the through holes 163X, and the through holes 165X may be from about 60 to 70 μm, for example.

Via wirings 166 electrically connecting the wiring layer 164 and the wiring layer 50 on an upper surface 165A of the insulating layer 165 are formed in the through holes 165X. The via wirings 166 fill in the through holes 165X, for example. Thus, the via wirings 166 are formed to have the same shape as that of the through holes 165X. Upper end surfaces 166A of the via wirings 166 are formed to be substantially flush with the upper surface 165A of the insulating layer 165, for example.

The second wiring structure 12 is stacked on the upper surface 165A of the insulating layer 165 and the upper end surfaces 166A of the via wirings 166. As an example, the wiring layer 50 in the second wiring structure 12 is stacked on the upper surface 165A of the insulating layer 165 so as to be connected to the upper end surfaces 166A of the via wirings 166. Like the upper surface 35A of the insulating layer 35 and the upper end surfaces 36A of the via wirings 36 of the first embodiment (see FIG. 1), for example, the upper surface 165A of the insulating layer 165 and the upper end surfaces 166A of the via wirings 166 may be polished.

The solder resist layer 13 is formed on the lower surface of the bottom insulating layer 161 in the first wiring structure 11B so as to cover the bottom wiring layer 160. Parts of the lower surfaces of the wiring patterns 160A are exposed as the external connection pads P2 through the openings 13X in the solder resist layer 13.

As described above, even with the first wiring structure 11B not having the core substrate 20, a volume ratio V1/V2 of a volume V1 of the wiring layers 50, 52, 54, and 56 relative to a volume V2 of the wiring layer 160 may still be set to range from 0.8 to 1.5 (more preferably, from 1.0 to 1.5), thereby reducing the amount of warp of the wiring substrate 10B. Even with the first wiring structure 11B not having the core substrate 20, the advantages (2) to (6) of the first embodiment may still be achieved.

The first wiring structure 11B may be manufactured by a publicly-known method, so that the manufacture thereof is not described in detail by referring to the drawings. The first wiring structure 11B may be manufactured by the following method, for example. First, a temporary substrate as a support is prepared. The wiring layer 160, the insulating layer 161, the wiring layer 162, the insulating layer 163, the wiring layer 164, and the insulating layer 165 are stacked in this order on the temporary substrate. Then, the via wirings 166 are formed on the insulating layer 165, thereby manufacturing a structure corresponding to the first wiring structure 11B on the temporary substrate. Like in the steps of FIGS. 7 to 10, the second wiring structure 12 is stacked on the upper surface of the first wiring structure 11B. Then, the temporary substrate is removed and the solder resist layer 13 is formed on the lower surface of the insulating layer 161, thereby manufacturing the wiring substrate 10B.

A fourth embodiment is described below by referring to FIG. 17. A wiring substrate 10C of the fourth embodiment differs from that of the first embodiment in that a first wiring structure 11C takes the place of the first wiring structure 11. The following description is mainly intended for the difference from the first embodiment. Members same as those illustrated in FIGS. 1 to 16 are identified by the same signs and will not be described in detail.

Figure 17:
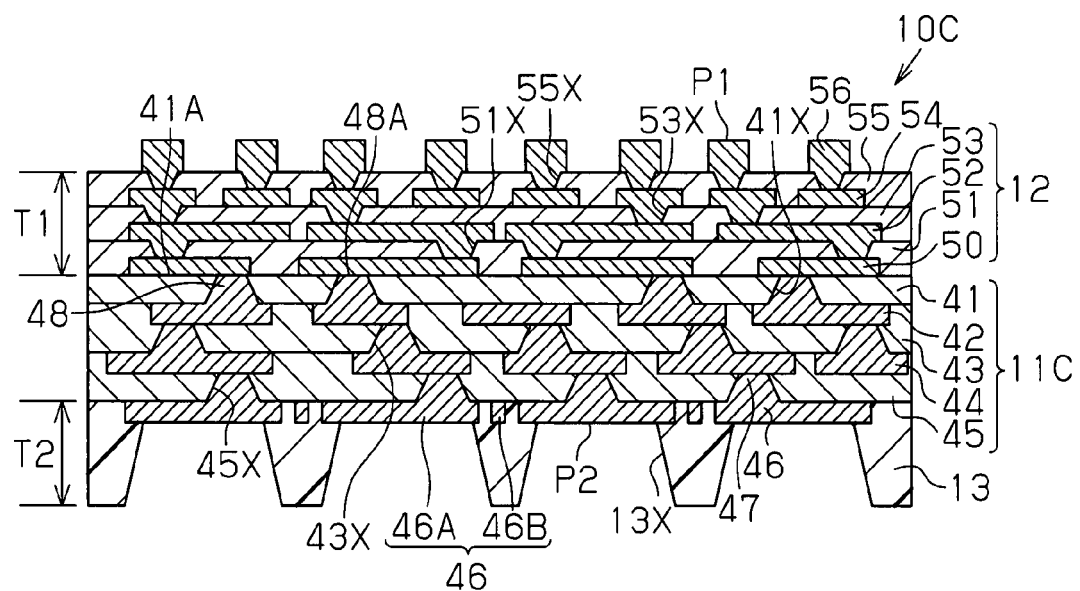
FIG. 17 is a diagrammatic sectional view of a wiring substrate according to a fourth embodiment.

As illustrated in FIG. 17, the first wiring structure 11C does not have the core substrate 20. The first wiring structure 11C is a low-density wiring layer with wiring layers of a density lower than those of the second wiring structure 12. The first wiring structure 11C includes the insulating layer 41, the wiring layer 42, the insulating layer 43, the wiring layer 44, the insulating layer 45, and the wiring layer 46 stacked in this order.

The insulating layer 41 in the top layer of the first wiring structure 11C is provided with the through holes 41X forming openings in intended positions of an upper surface 41A of the insulating layer 41 while passing through the insulating layer 41 in the thickness direction thereof. The upper surface 41A of the insulating layer 41 is lower in surface roughness than the inner side surfaces of the through holes 41X, for example.

The through holes 41X, the through holes 43X, and the through holes 45X in the insulating layers 41, 43, and 45 respectively in the first wiring structure 11C are each formed into a tapered shape that becomes greater in a diameter from an upper side (side near the second wiring structure 12) toward a lower side (side near the solder resist layer 13) of FIG. 17. As an example, the through holes 41X, the through holes 43X, and the through holes 45X are each formed as a truncated cone with a lower opening end of a diameter larger than that of an upper opening end thereof. In this way, each of the through holes 41X, the through holes 43X, and the through holes 45X in the first wiring structure 11C are each formed into a tapered shape with an opening on a side near the solder resist layer 13 larger than an opening on a side near the second wiring structure 12.

The wiring layer 42 is formed on the lower surface of the insulating layer 41. The wiring layer 42 is electrically connected to via wirings 48 formed in the through holes 41X. The wiring layer 42 is formed integrally with the via wirings 48, for example. The via wirings 48 fill in the through holes 41X. Thus, the via wirings 48 are formed to have the same shape as that of the through holes 41X. Upper end surfaces 48A of the via wirings 48 are formed to be substantially flush with the upper surface 41A o the insulating layer 41, for example.

The second wiring structure 12 is stacked on the upper surface 41A of the insulating layer 41 and the upper end surfaces 48A of the via wirings 48. As an example, the wiring layer 50 in the second wiring structure 12 is stacked on the upper surface 41A of the insulating layer 41 so as to be connected to the upper end surfaces 48A of the via wirings 48. Like the upper surface 35A of the insulating layer 35 and the upper end surfaces 36A of the via wirings 36 of the first embodiment (see FIG. 1), for example, the upper surface 41A of the insulating layer 41 and the upper end surfaces 48A of the via wirings 48 may be polished.

Even with the first wiring structure 11C not having the core substrate 20, a volume ratio V1/V2 of a volume V1 of the wiring layers 50, 52, 54, and 56 relative to a volume V2 of the bottom wiring layer 46 may still be set to be in a range from 0.8 to 1.5 (more preferably, from 1.0 to 1.5), thereby reducing the amount of warp of the wiring substrate 10C. Even with the first wiring structure 11C not having the core substrate 20, the same or corresponding advantages (2) to (6) of the first embodiment may still be achieved.

The first wiring structure 11C may be manufactured by a publicly-known method, so that the manufacture thereof is not described in detail by referring to the drawings. The first wiring structure 11C may be manufactured by the following method, for example. First, a temporary substrate as a support is prepared. The insulating layer 41, the wiring layer 42, the insulating layer 43, the wiring layer 44, the insulating layer 45, and the wiring layer 46 are stacked in this order on the temporary substrate, thereby manufacturing a structure corresponding to the first wiring structure 11C on the temporary substrate. After the temporary substrate is removed from the first wiring structure 11C, the second wiring structure 12 is stacked on the upper surface 41A of the insulating layer 41 and the upper end surfaces 48A of the via wirings 48. Further, the solder resist layer 13 is formed on the lower surface of the insulating layer 45, thereby manufacturing the wiring substrate 10C.

Figure 18:
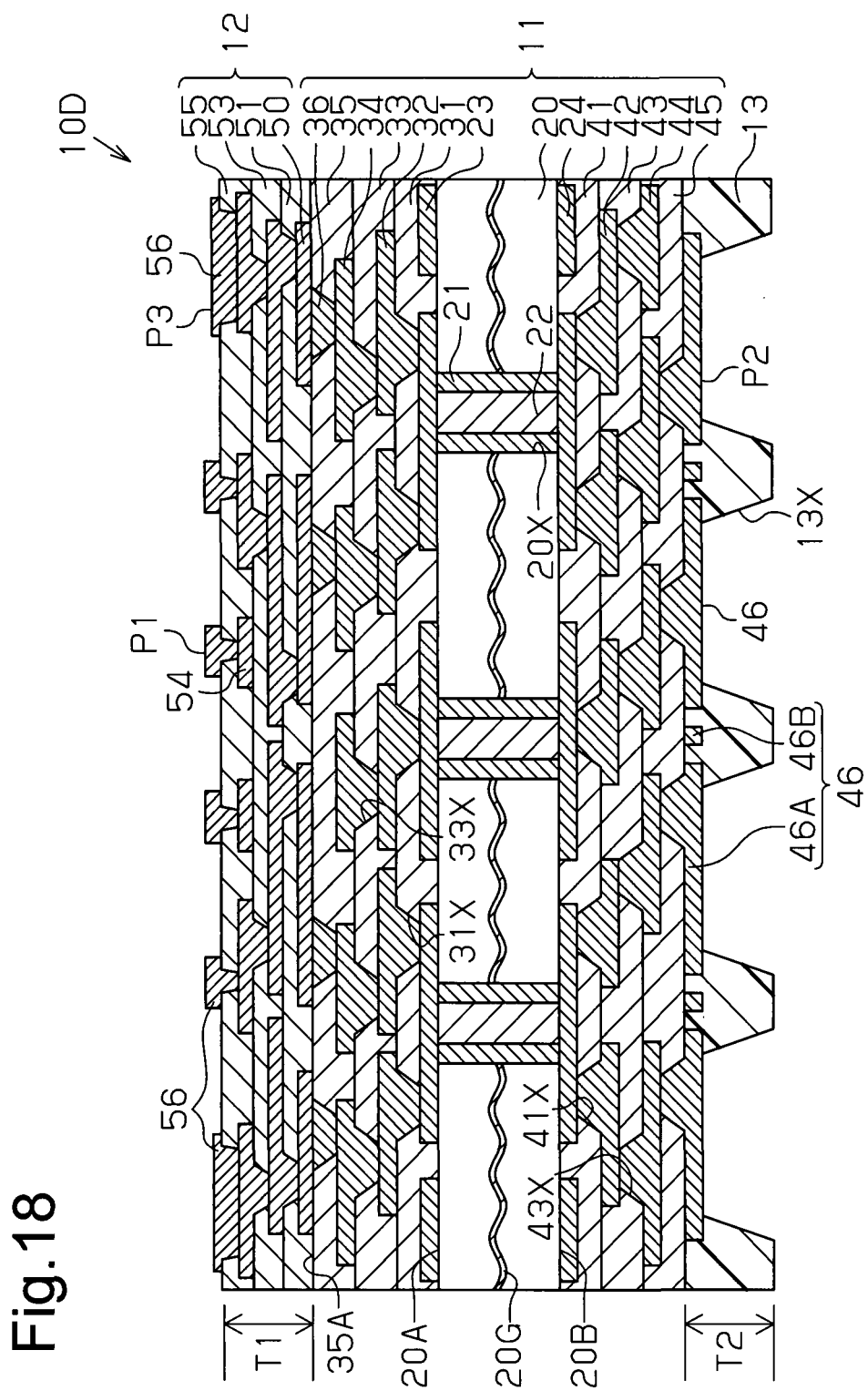
FIG. 18 is a diagrammatic sectional view of a wiring substrate according to a fifth embodiment.

A fifth embodiment is described below by referring to FIG. 18. A wiring substrate 10D of the fifth embodiment differs from that of the first embodiment in the structure of the top wiring layer 56. The following description is mainly intended for the difference from the first embodiment. Members same as those illustrated in FIGS. 1 to 17 are identified by the same signs and will not be described in detail.

In the wiring substrate 10D, the top wiring layer 56 in the wiring substrate 10 illustrated in FIG. 1 is provided with connection pads P3 to be electrically connected to a different wiring substrate or a different semiconductor device in addition to the pads P1.

The connection pads P3 are formed in regions external to the pads P1, for example. As an example, the connection pads P3 are arranged in a peripheral pattern on the upper surface of the top insulating layer 55 in a plan view. The pad surfaces of the connection pads 3 may have any planar shape and any size. The pad surface of each connection pad P3 is larger than that of the pad P1, for example. As an example, the pad surface of each connection pad P3 may be a circle of a diameter from about 120 to 170 μm.

Even with the wiring layer 56 with the connection pads P3, a volume ratio V1/V2 of a volume V1 of the wiring layers 50, 52, 54, and 56 relative to a volume V2 of the bottom wiring layer 46 may still be set to range from 0.8 to 1.5 (more preferably, from 1.0 to 1.5), thereby reducing the amount of warp of the wiring substrate 10D. Even with the wiring substrate 10D including the connection pads P3 provided to the wiring layer 56, the same or corresponding advantages (2) to (6) of the first embodiment may still be achieved.

Figure 19:
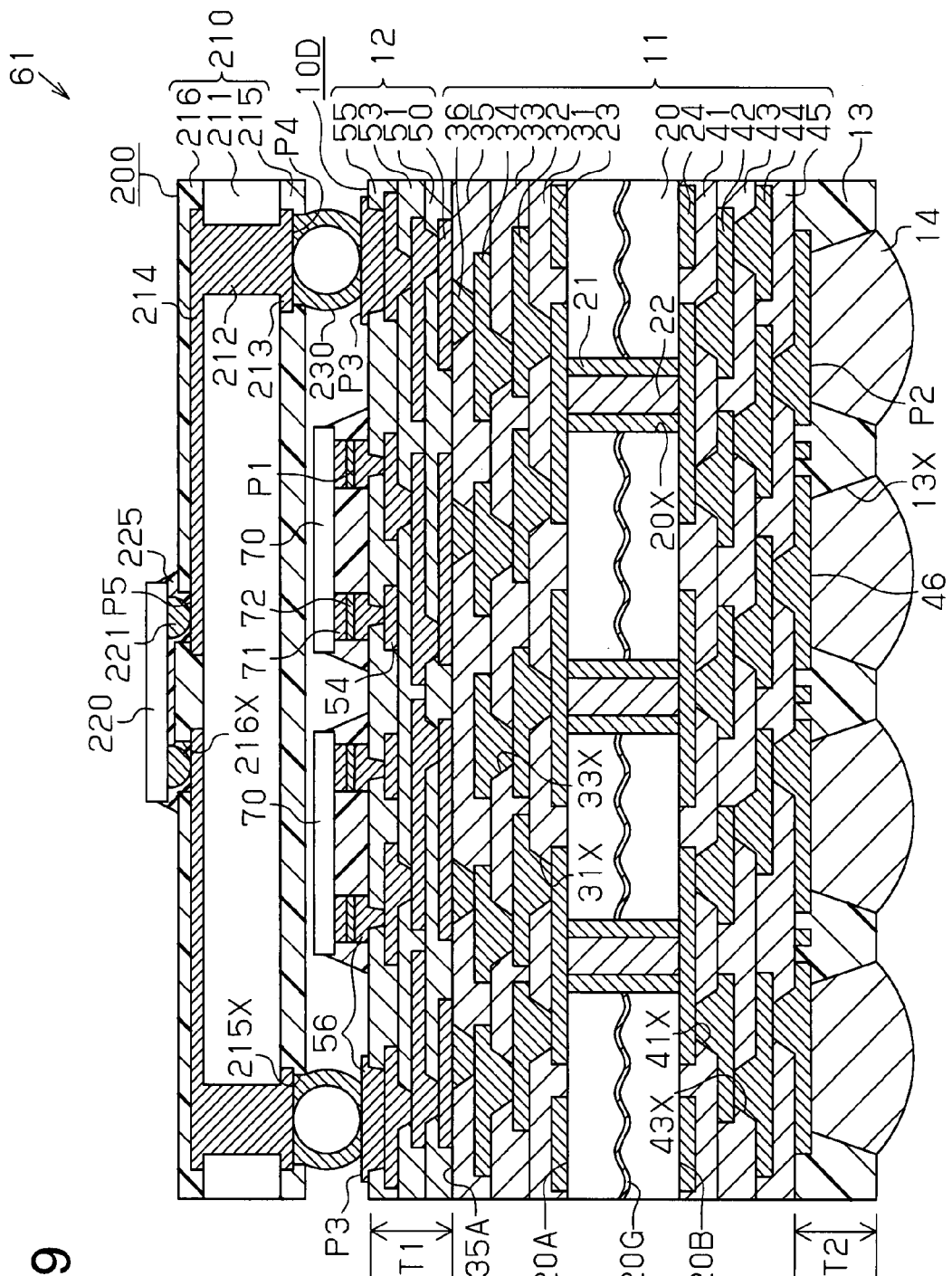
FIG. 19 is a diagrammatic sectional view of a semiconductor device including the wiring substrate of FIG. 18.
Figure 20:
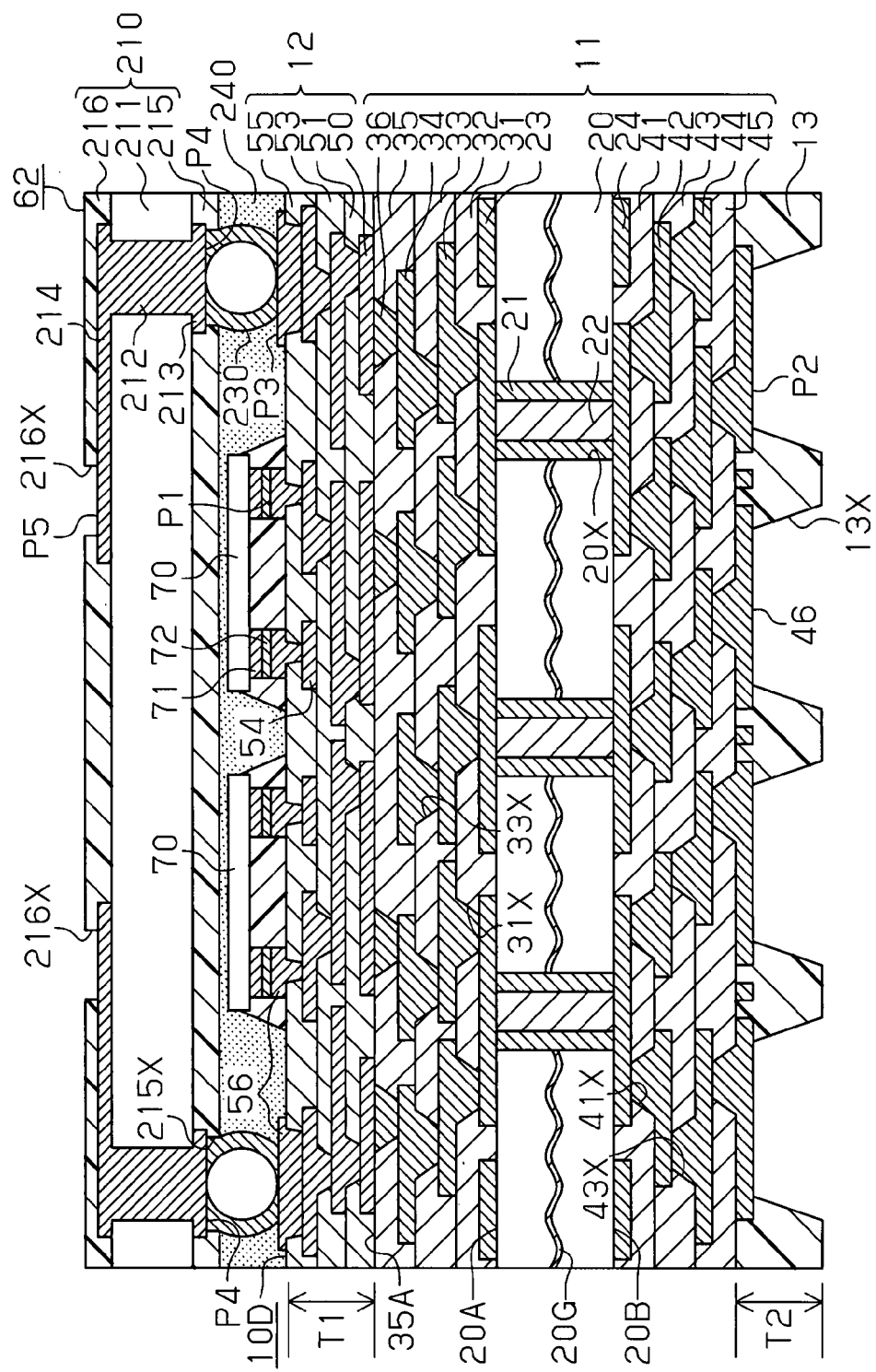
FIG. 20 is a diagrammatic sectional view of a substrate with a built-in electronic component including the wiring substrate of FIG. 18.
Figure 21:
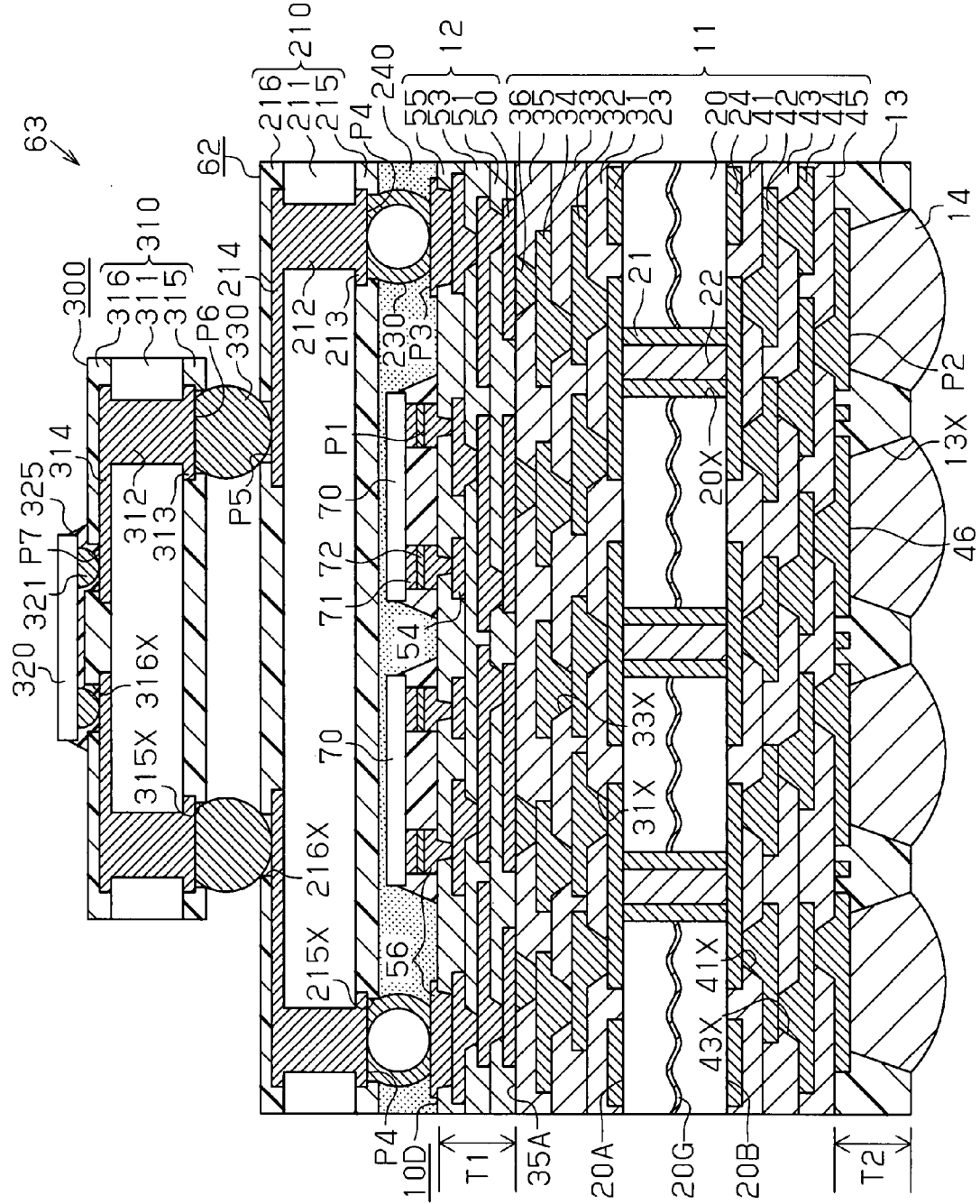
FIG. 21 is a diagrammatic sectional view of a semiconductor device including the wiring substrate of FIG. 18.

The following describes exemplary applications of the wiring substrate 10D by referring to FIGS. 19 to 21.

(First Exemplary Application)

A semiconductor device 61 including the wiring substrate 10D and a different semiconductor package 200 mounted on the wiring substrate 10D is described first by referring to FIG.

19. The semiconductor device 61 includes the wiring substrate 10D, one or multiple (in FIG. 19, two) semiconductor chips 70 mounted on the wiring substrate 10D, the semiconductor package 200 stacked on and bonded to the wiring substrate 10D, and external connection terminals 14.

The structure of the semiconductor package 200 is described next briefly. The semiconductor package 200 includes a wiring substrate 210, one or multiple semiconductor chips 220 mounted on the wiring substrate 210, and an underfill resin 225 formed between the wiring substrate 210 and the semiconductor chip 220.

The wiring substrate 210 includes a core substrate 211, penetration electrodes 212 formed in the core substrate 211, a bottom wiring layer 213 formed on the lower surface of the core substrate 211, a top wiring layer 214 formed on the upper surface of the core substrate 211, a solder resist layer 215 and 216. The wiring layers 213 and 214 are electrically connected to each other through the penetration electrodes 212.

The solder resist layer 215 is stacked on the lower surface of the core substrate 211 so as to cover the wiring layer 213 partially. The solder resist layer 215 is provided with openings 215X through which parts of the wiring layer 213 are exposed as connection pads P4. The connection pads P4 are electrically connected to the connection pads P3 of the wiring substrate 10D and are provided so as to face corresponding connection pads P3.

The solder resist layer 216 is stacked on the upper surface of the core substrate 211 so as to cover the wiring layer 214 partially. The solder resist layer 216 is provided with openings 216X through which parts of the wiring layer 214 are exposed as pads P5. The pads P5 function as pads for mounting of an electronic component to be used for making electrical connection to an electronic component such as a semiconductor chip or a passive element, for example.

The semiconductor chip 220 is flip-chip mounted on the wiring substrate 210. Specifically, bumps 221 formed on a circuit formation surface (in FIG. 19, lower surface) of the semiconductor chip 220 are bonded to the pads P5, thereby electrically connecting the semiconductor chip 220 through the bumps 221 to the wiring layer 214. The underfill resin 225 is formed in a gap between the wiring substrate 210 and the semiconductor chip 220 flip-chip bonded in this way.

Solder balls 230 are bonded onto the connection pads P3 of the wiring substrate 10D. The solder balls 230 are interposed between the wiring substrate 10D and the semiconductor package 200. Each of the solder balls 230 has one end bonded to the connection pad P3 and an opposite end bonded to the connection pad P4. The solder balls 230 may be a solder ball including a conductive core ball (such as a copper core ball) or a resin core ball and solder covering the circumference of the core ball, for example. Alternatively, the solder balls 230 may be a solder ball without a conductive core ball or a resin core ball.

In this way, the wiring substrate 10D and the semiconductor package 200 are stacked and bonded through the solder balls 230, thereby forming the semiconductor device 61 of a POP (package on package) structure.

The external connection terminals 14 are formed on the external connection pads P2 of the wiring substrate 10D. The external connection terminals 14 are to be electrically connected to pads of a mounting substrate such as a motherboard not illustrated in the drawings, for example. Solder balls or lead pins may be used as the external connection terminals 14, for example.

The amount of warp of the wiring substrate 10D is reduced when the semiconductor package 200 is to be stacked on and bonded to the wiring substrate 10D. Thus, the semiconductor package 200 may be stacked on and bonded to the wiring substrate 10D easily.

(Second Exemplary Application)

Application of the wiring substrate 10D to a substrate 62 with a built-in electronic component is described next by referring to FIG. 20.

The substrate 62 with a built-in electronic component includes the wiring substrate 10D, one or multiple (in FIG. 20, two) semiconductor chips 70 mounted on the wiring substrate 10D, a different wiring substrate 210 mounted on the wiring substrate 10D, and an encapsulation resin 240 formed in space between the wiring substrates 10D and 210.

In the substrate 62 with a built-in electronic component, the wiring substrates 10D and 210 are stacked and bonded through the solder balls 230. The solder balls 230 are interposed between the wiring substrates 10D and 210. Each of the solder balls 230 has one end bonded to the connection pad P3 and an opposite end bonded to the connection pad P4.

The encapsulation resin 240 fills in the space between the wiring substrates 10D and 210. The wiring substrate 210 is fixed to the wiring substrate 10D and the semiconductor chip 70 mounted on the wiring substrate 10D is filled with the encapsulation resin 240. Specifically, the encapsulation resin 240 functions as an adhesive for adhesive contact between the wiring substrates 10D and 210 and as a protective layer to protect the semiconductor chip 70.

As described above, the substrate 62 with a built-in electronic component includes the semiconductor chip 70 as an electronic component arranged in the space between the wiring substrates 10D and 210.

(Third Exemplary Application)

A semiconductor device 63 including the substrate 62 with a built-in electronic component illustrated in FIG. 20 and a different semiconductor package 300 mounted on the substrate 62 is described next by referring to FIG. 21. The semiconductor device 63 includes the substrate 62 with a built-in electronic component including the wiring substrate 10D, a semiconductor package 300 stacked on and bonded to the substrate 62 with a built-in electronic component, and the external connection terminals 14. The pads P5 formed in the wiring substrate 210 of the substrate 62 with a built-in electronic component function as pads to be electrically connected to a different wiring substrate or a different semiconductor device.

The structure of the semiconductor package 300 is described next briefly. The semiconductor package 300 includes a wiring substrate 310, one or multiple semiconductor chips 320 mounted on the wiring substrate 310, and an underfill resin 325 formed between the wiring substrate 310 and the semiconductor chip 320.

The wiring substrate 310 includes a core substrate 311, penetration electrodes 312 formed in the core substrate 311, a bottom wiring layer 313 formed on the lower surface of the core substrate 311, a top wiring layer 314 formed on the upper surface of the core substrate 311, a solder resist layer 315, and a solder resist layer 316. The wiring layers 313 and 314 are electrically connected to each other through the penetration electrodes 312.

The solder resist layer 315 is stacked on the lower surface of the core substrate 311 so as to cover the wiring layer 313 partially. The solder resist layer 315 is provided with openings 315X through which parts of the wiring layer 313 are exposed as connection pads P6. The connection pads P6 are electrically connected to the connection pads P5 of the substrate 62 with a built-in electronic component and are provided so as to face corresponding connection pads P5.

The solder resist layer 316 is stacked on the upper surface of the core substrate 311 so as to cover the wiring layer 314 partially. The solder resist layer 316 is provided with openings 316X through which parts of the wiring layer 314 are exposed as pads P7. The pads P7 function as pads for mounting of an electronic component to be used for making electrical connection to an electronic component such as a semiconductor chip or a passive element, for example.

The semiconductor chip 320 is flip-chip mounted on the wiring substrate 310. Specifically, bumps 321 formed on a circuit formation surface (in FIG. 21, lower surface) of the semiconductor chip 320 are bonded to the pads P7, thereby electrically connecting the semiconductor chip 320 through the bumps 321 to the wiring layer 314. The underfill resin 325 is formed in a gap between the wiring substrate 310 and the semiconductor chip 320 flip-chip bonded in this way.

The semiconductor package 300 is stacked on and bonded to the substrate 62 with a built-in electronic component through solder balls 330. The solder balls 330 are interposed between the substrate 62 with a built-in electronic component and the semiconductor package 300. Each of the solder balls 330 has one end bonded to the pad P5 of the substrate 62 with a built-in electronic component and an opposite end bonded to the connection pad P6.

It should be apparent to those skilled in the art that the present invention may be embodied in many other specific forms without departing from the scope of claims. For example, the embodiment may be appropriately modified in the following modes.

Like in the wiring substrate 10D of the fifth embodiment, the top wiring layer 56 may be provided with the connection pads P3 in each of the wiring substrates 10A to 10C of the second to fourth embodiments respectively.

In the embodiments, the bottom wiring layers 46, 142, and 160 in the first wiring structures 11 and 11A to 11C has the wiring patterns 46A and the dummy patterns 46B, the wiring patterns 142A and the dummy patterns 142B, and the wiring patterns 160A and the dummy patterns 160B respectively. Alternatively, dummy patterns comparable to the dummy patterns 46B, the dummy patterns 142B, or the dummy patterns 160B may be formed in at least one of the wiring layers 50, 52, 54, and 56 in the second wiring structure 12.

Figure 22:
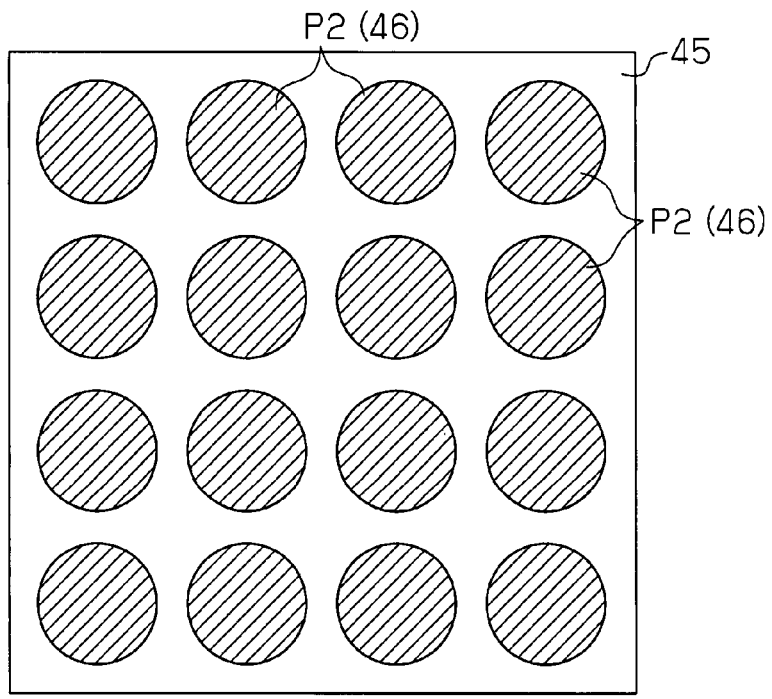
FIG. 22 is a diagrammatic plan view illustrating a bottom wiring layer in a wiring substrate according to a modification.

In the embodiments and modifications, the respective structures of the wiring layers 46, 142, and 160 may be changed. As an example, the dummy patterns 46B, the dummy patterns 142B, and the dummy patterns 160B of the embodiments and the modifications may be omitted. In this case, as illustrated in FIG. 22, for example, the wiring layer 46 may be formed only of the external connection pads P2. In the example of FIG. 22, the external connection pads P2 are arranged on the entire lower surface of the bottom insulating layer 45 in a lattice pattern in a plan view, for example. The wiring layer 46 without the dummy patterns 46B may be formed of the external connection pads P2 and a wiring pattern connected to the external connection pads P2, for example. The wiring layers 142 and 160 may be changed in the same way as the wiring layer 46.

If the dummy patterns 46B, the dummy patterns 142B, and the dummy patterns 160B are omitted as described above, the volume ratio V1/V2 may be set to fall in a range from 0.8 to 1.5 by appropriately adjusting the thickness or area of each of the bottom wiring layers 46, 142, and 160 in the first wiring structures 11 and 11A to 11C and the thickness or area of each of the wiring layers 50, 52, 54, and 56.

In each of the embodiments, the thickness T2 of the solder resist layer 13 is equal to or greater than the thickness T1 of the second wiring structure 12. Alternatively, the thickness T2 of the solder resist layer 13 may be smaller than the thickness T1 of the second wiring structure 12, for example.

In each of the embodiments, the upper end surfaces 36A, the upper end surfaces 132A, the upper end surfaces 166A, and the upper end surfaces 48A of the via wirings 36, the via wirings 132, the via wirings 166, and the via wirings 48 are formed to be flush with the upper surfaces 35A, 131A, 165A, and 41A of the insulating layers 35, 131, 165, and 41 respectively. Alternatively, the upper end surfaces 36A, the upper end surfaces 132A, the upper end surfaces 166A, and the upper end surfaces 48A of the via wirings 36, the via wirings 132, the via wirings 166, and the via wirings 48 may be formed as recesses to be lower in positions than the upper surfaces 35A, 131A, 165A, and 41A of the insulating layers 35, 131, 165, and 41 respectively, still alternatively, may be formed as projections to be higher in positions than the upper surfaces 35A, 131A, 165A, and 41A of the insulating layers 35, 131, 165, and 41 respectively.

The respective sectional shapes of the through holes formed in the wiring substrates 10 and 10A to 10D of the embodiments are not specifically limited. As an example, the through holes formed in the wiring substrates 10 and 10A to 10D may each have a straight shape (substantially rectangular in a cross section).

In the first wiring structures 11 and 11A to 11C of the embodiments, the number of wiring layers and that of insulating layers, and routing of the wiring layers and that of the insulating layers may be modified or changed in various ways. As an example, in the second embodiment, one insulating layer 131 and one insulating layer 141 are formed on the upper surface 20A and the lower surface 20B of the core substrate 20 respectively. Alternatively, two or more insulating layers with a reinforcing material may be formed on each of the upper and lower surfaces 20A and 20B of the core substrate 20.

In each of the embodiments, the insulating layers 51, 53, and 55 in the second wiring structure 12 are made of an insulating resin containing a photosensitive resin as the major component thereof. Alternatively, the insulating layers 51, 53, and 55 in the second wiring structure 12 may be made of a non-photosensitive insulating resin containing a thermosetting resin as the major component thereof.

In the second wiring structure 12 of each of the embodiments, the number of wiring layers 50, 52, 54, and 56, that of insulating layers 51, 53, and 55, the routing of the wiring layers, and that of the insulating layers may be modified or changed in various ways.

In the semiconductor device 60 of the first embodiment, the semiconductor chip 70 is mounted on the wiring substrate 10. Instead of the semiconductor chip 70, a chip component such as a chip capacitor, a chip resistor or a chip inductor, or an electronic component such as a crystal oscillator other than a semiconductor chip may be mounted on the wiring substrate 10. An electronic component such as the semiconductor chip 70 may be mounted on the wiring substrates 10A to 10C of the second to fourth embodiments.

Mounting of the semiconductor chip 70, a chip member, and an electronic component such as a crystal oscillator may be modified or changed in various ways (as an example, flip-chip mounting, wire bonding mounting, solder mounting, or a combination thereof is applicable).

The penetration electrodes 21 in each of the embodiments may be changed to penetration electrodes with plated metal layers (such as Cu layers) completely filling in the through holes 20X.

(Warp Simulation)

Several sample wiring substrates of the same structure as that of the wiring substrate 10 of FIG. 1 were defined. Each sample wiring substrate is a rectangular plate shape of 19.5 mm×13.5 mm. The core substrate 20 was fixed at a thickness of 800 µm, the wiring layers 23 and 24 in the first wiring structure 11 were fixed at a thickness of 35 µm, the wiring layers 32, 34, 42, and 44 in the first wiring structure 11 were fixed at a thickness of 15 µm, the insulating layers 31, 33, 35, 41, 43, and 45 in the first wiring structure 11 were fixed at a thickness of 30 µm, and the solder resist layer 13 was fixed at a thickness of 25 µm. The volume ratio V1/V2 of the volume V1 of the wiring layers 50, 52, 54, and 56 in the second wiring structure 12 relative to the volume V2 of the bottom wiring layer 46 was changed in a range from 0.5 to 2.5. The sample wiring substrates according to Example had the volume ratio V1/V2 of 0.8, 1.0, 1.3. and 1.5. The sample wiring substrates according to Comparative Example had the volume ratio V1/V2 of 0.5, 1.9, and 2.5.

Figure 23:
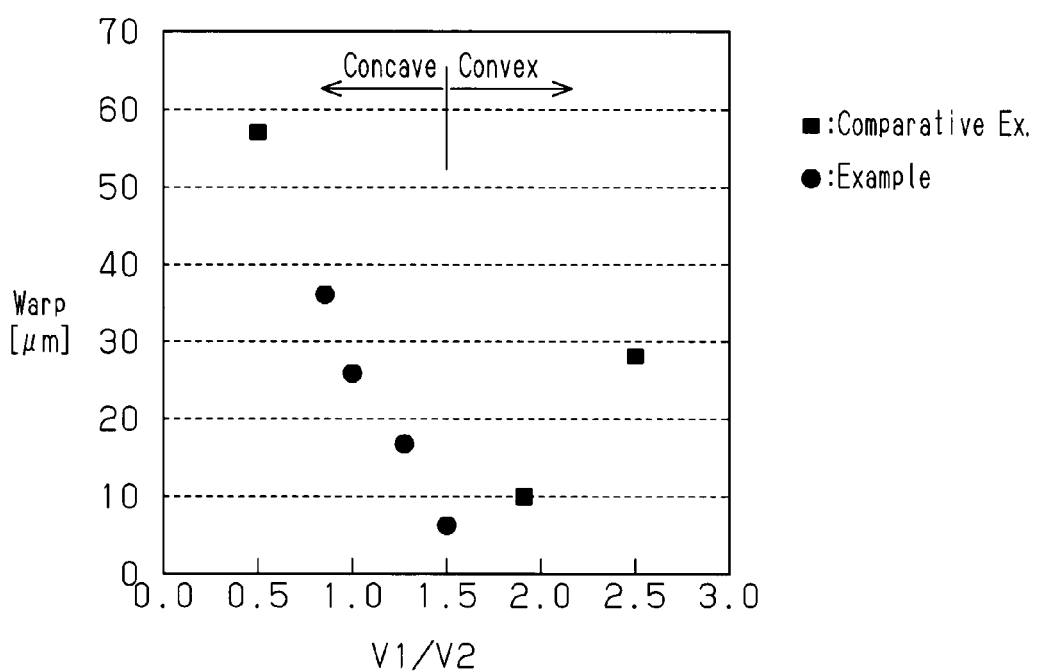
FIG. 23 illustrates a result of simulation conducted to determine warp of a wiring substrate.

Computer simulation of warp was conducted on each sample wiring substrate. FIG. 23 illustrates a result of the simulation. As illustrated in FIG. 23, reduction in the amount of warp of the sample wiring substrate was confirmed with the volume ratio V1/V2 approaching a certain value (1.5). Setting the volume ratio V1/V2 in a range from 0.8 to 2.5 was confirmed to reduce the amount of warp of the sample wiring substrate compared to Comparative Example where the volume ratio V1/V2 was 0.5. The volume ratio V1/V2 smaller than the certain value (1.5) was confirmed to produce the tendency of the sample wiring substrate to warp such that the upper surface (side near the second wiring structure 12) becomes concave. The volume ratio V1/V2 (1.9 and 2.5) greater than the certain value (1.5) was confirmed to produce the tendency of the sample wiring substrate to warp such that the upper surface (side near the second wiring structure 12) becomes convex.

The sample wiring substrate has a structure where the second wiring structure 12 as a high-density wiring layer and the solder resist layer 13 are formed on the upper and lower surfaces respectively of the first wiring structure 11, specifically a vertically asymmetric structure relative to the first wiring structure 11. In this regard, the sample wiring substrate might suffer from warp easily. However, it was found that even with the sample wiring substrate of a vertically asymmetric structure, warpage of the sample wiring substrate may still be alleviated by approximating the volume ratio V1/V2 to the certain value of 1.5 or near 1.5. Meanwhile, it was also found that making the volume ratio V1/V2 both higher and lower than the certain value of 1.5 or near 1.5 produces the tendency of the sample wiring substrate to warp more seriously.

Studies conducted by the present inventors have found that controlling the amount of warp of the sample wiring substrate at 40 µm or less is preferable, more preferably, 30 µm or less for mounting of an electronic component such as a semiconductor chip on the pads P1 of the sample wiring substrate. These studies have also found that the sample wiring substrate should preferably warp in a direction that makes a side near the second wiring structure 12 concave.

The following describes why the direction of warp that makes the side near the second wiring structure 12 concave is preferable by referring to FIG. 24.

The coefficient of thermal expansion of insulating layers (from about 50 to 70 ppm/degree Celsius, for example) in the second wiring structure 12 (high-density wiring layer) is higher than that of the core substrate 20 (about 10 ppm/degree Celsius, for example) in the sample wiring substrate. As a result, the second wiring structure 12 expands more than the core substrate 20 during thermal process performed for mounting the semiconductor chip 70 on the pads P1 of the sample wiring substrate. Thus, if the sample wiring substrate warps such that the side near the second wiring structure 12 becomes convex as illustrated in FIG. 24B before mounting of the semiconductor chip 70, the thermal process for mounting the semiconductor chip 70 makes the sample wiring substrate warp more seriously. In contrast, if the sample wiring substrate warps such that the side near the second wiring structure 12 becomes concave as illustrated in FIG. 24A before mounting of the semiconductor chip 70, the thermal process for mounting the semiconductor chip 70 alleviates the warp of the sample wiring substrate. As understood from above, it is preferable that the sample wiring substrate warp in a direction that makes the side near the second wiring structure 12 concave before mounting of the semiconductor chip 70.

In view of these considerations, the result of the simulation in FIG. 23 shows that setting the volume ratio V1/V2 in a range from 0.8 to 1.5 is preferable in order for the sample wiring substrate to warp in a direction that makes the side near the second wiring structure 12 concave and for the amount of warp to be controlled at 40 µm or less. Setting the volume ratio V1/V2 in a range from 1.0 to 1.5 is more preferable in order for the sample wiring substrate to warp in a direction that makes the side near the second wiring structure 12 concave and for the amount of warp to be controlled at 30 µm or less.

Changing the volume ratio V1/V2 from 1.5 to 1.9 produced a change of 3.9 µm in the amount of warp, meaning that changing the volume ratio V1/V2 from 1.5 to 1.9 produced substantially no change in the amount of warp. Thus, conducting simulation by changing the volume ratio V1/V2 finely between 1.5 and 1.9 does not produce an actually effective result in light of a relationship with simulation accuracy. The volume ratio V1/V2 of 1.5 defines a direction of warp that makes the side near the second wiring structure 12 concave. The volume ratio V1/V2 of 1.9 defines the direction of warp that makes the side near the second wiring structure 12 convex. A direction of warp changes with the volume ratio V1/V2 ranging between 1.5 and 1.9. In light of the foregoing, the volume ratio V1/V2 of 1.5 was considered to be a turning point of a direction of warp and "1.5" was defined as an upper limit of the volume ratio V1/V2.

The solder resist layer 13 may be referred to as an outermost insulating layer. The insulating layers 35, 41, 131, and 165 may each be referred to as a first insulating layer or a top insulating layer. The wiring layers 46, 142, and 160 may each be referred to as a bottom wiring layer. The wiring layer 50 may be referred to as a first wiring layer. The wiring layer 56 may be referred to as a top wiring layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although embodiments of the present invention have been described in detail, it should be understood that various changes, substitutions, and alterations could be made hereto without departing from the spirit and scope of the invention.

The invention claimed is:

1. A wiring substrate comprising:
   a first wiring structure formed by a stack of wiring layers and insulating layers;
   a second wiring structure formed by a stack of wiring layers and insulating layers and stacked on an upper surface of the first wiring structure; and
   an outermost insulating layer stacked on a lower surface of the first wiring structure, the outermost insulating layer covering a part of a bottom wiring layer of the wiring layers in the first wiring structure, wherein
   the second wiring structure has a wiring density higher than that of the first wiring structure, and
   a volume ratio V1/V2 is from 0.8 to 1.5, where V1 represents the volume of the wiring layers in the second wiring structure, and V2 represents the volume of the bottom wiring layer in the first wiring structure.

2. The wiring substrate according to claim 1, wherein the volume ratio V1/V2 is from 1.0 to 1.5.

3. The wiring substrate according to claim 1, wherein the bottom wiring layer in the first wiring structure includes a wiring pattern and a dummy pattern formed in a region where the wiring pattern is not formed.

4. The wiring substrate according to claim 1, wherein each of the insulating layers in the first wiring structure contains a non-photosensitive resin as the major component thereof,
   each of the insulating layers in the second wiring structure contains a photosensitive resin as the major component thereof and is thinner than any layer of the insulating layers in the first wiring structure, and
   the outermost insulating layer of the wiring substrate contains a photosensitive resin as the major component thereof.

5. The wiring substrate according to claim 4, wherein the thickness of the outermost insulating layer is equal to or greater than a total of the thicknesses of all the insulating layers in the second wiring structure.

6. The wiring substrate according to claim 1, wherein the first wiring structure includes
   a first insulating layer forming a top layer of the first wiring structure, the first insulating layer including a through hole forming an opening in an upper surface of the first insulating layer and extending through the first insulating layer in a thickness direction thereof, and
   a via wiring filling in the through hole and including an upper end surface exposed from the first insulating layer, and wherein the second wiring structure includes a first wiring layer stacked on the upper surface of the first insulating layer and the upper end surface of the via wiring, and the first wiring layer includes a seed layer connected to the upper end surface of the via wiring.

7. The wiring substrate according to claim 1, wherein the first wiring structure includes
   a core substrate made of an insulating resin with a reinforcing material;
   an insulating layer stacked on an upper surface of the core substrate and made of an insulating resin with a reinforcing material; and
   an insulating layer stacked on a lower surface of the core substrate and made of an insulating resin with a reinforcing material.

8. The wiring substrate according to claim 1, wherein
   each through hole formed in the insulating layers in the first wiring structure is formed into a tapered shape with an opening on a side near the outermost insulating layer and an opening on a side near the second wiring structure larger than the opening on the side near the outermost-insulating layer, or
   each through hole formed in the insulating layers in the first wiring structure is formed into a tapered shape with an opening on a side near the second wiring structure and an opening on a side near the outermost insulating layer larger than the opening on the side near the second wiring structure.

9. A semiconductor device comprising:
   the wiring substrate according to claim 1; and
   a semiconductor chip flip-chip mounted on a top insulating layer in the second wiring structure.

10. A method of manufacturing a wiring substrate, comprising:
   forming a first wiring structure including insulating layers and wiring layers, each of the insulating layers containing a non-photosensitive resin as the major component thereof;
   stacking a second wiring structure on an upper surface of the first wiring structure, the second wiring structure including insulating layers and wiring layers, each of the insulating layers of the second wiring structure containing a photosensitive resin as the major component thereof; and stacking on a lower surface of the first wiring structure an outermost insulating layer containing a photosensitive resin as the major component thereof, wherein
   the forming a first wiring structure includes
      forming a top insulating layer covering one of the wiring layers in the first wiring structure, the top insulating layer containing a non-photosensitive resin as the major component thereof;
      forming a through hole passing through the top insulating layer in a thickness direction thereof;
      forming a conductive layer filling in the through hole and covering an upper surface of the top insulating layer; and
      smoothing the upper surface of the top insulating layer and forming a via wiring having an upper end surface exposed from the top insulating layer by polishing an upper surface of the conductive layer and the upper surface of the top insulating layer,
   the stacking a second wiring structure includes forming a wiring layer on the upper surface of the top insulating layer bonded to the upper end surface of the via wiring, and
   a volume ratio V1/V2 is from 0.8 to 1.5, where V1 represents the volume of the wiring layers in the second wiring structure, and V2 represents the volume of a wiring layer formed in a bottom layer of the first wiring structure.

* * * * *